(12) United States Patent
Kagaya

(10) Patent No.: US 10,904,997 B2
(45) Date of Patent: Jan. 26, 2021

(54) PRINTED CIRCUIT BOARD, OPTICAL MODULE, AND OPTICAL TRANSMISSION EQUIPMENT

(71) Applicant: Lumentum Japan, Inc., Kanagawa (JP)

(72) Inventor: Osamu Kagaya, Tokyo (JP)

(73) Assignee: Lumentum Japan, Inc., Kanagawa (JP)

(*) Notice: Subject to any disclaimer, the term of this patent is extended or adjusted under 35 U.S.C. 154(b) by 4 days.

(21) Appl. No.: 16/456,728

(22) Filed: Jun. 28, 2019

(65) Prior Publication Data
US 2020/0045808 A1 Feb. 6, 2020

(30) Foreign Application Priority Data
Aug. 2, 2018 (JP) .................................. 2018-146067

(51) Int. Cl.
*H05K 1/02* (2006.01)
*H01P 3/08* (2006.01)
(Continued)

(52) U.S. Cl.
CPC ......... *H05K 1/0245* (2013.01); *G02B 6/4277* (2013.01); *G02B 6/4279* (2013.01);
(Continued)

(58) Field of Classification Search
CPC .... H05K 1/0245; H05K 1/181; H05K 9/0024; H05K 1/115; H05K 2201/093;
(Continued)

(56) References Cited

U.S. PATENT DOCUMENTS 8,994,470 B2 * 3/2015 Sakai ........................ H01P 7/08
333/12
9,583,807 B2 * 2/2017 Kushta ..................... H05K 1/16
(Continued)

FOREIGN PATENT DOCUMENTS

JP 2012-227887 A 11/2012
WO 2011004453 A1 12/2012

*Primary Examiner* — Rockshana D Chowdhury
(74) *Attorney, Agent, or Firm* — Harrity & Harrity, LLP

(57) ABSTRACT

Provided is a printed circuit board realizing selective inhibition of electromagnetic noise and enabling high-density arrangement of differential transmission lines without increasing cost. The printed circuit board includes a pair of strip conductors (first layer), a first resonance conductor plate, a ground conductive layer (together with a second layer) including an opening portion, a second resonance conductor plate (third layer), a third resonance conductor plate (fourth layer), first via holes connecting the first and second resonance conductor plates, a second via hole connecting the second and third resonance conductor plates, and third via holes connecting the third resonance conductor plate and the ground conductive layer, wherein a polygon obtained by sequentially connecting centers of the adjacent third via holes overlaps so as to include the first resonance conductor plate, and center-to-center distance between the adjacent third via holes is 0.5 wavelength or less at frequency corresponding to the bit rate.

10 Claims, 21 Drawing Sheets

(51) Int. Cl.
*H01P 5/02* (2006.01)
*G02B 6/42* (2006.01)
*H05K 1/11* (2006.01)
*H05K 1/18* (2006.01)
*H05K 9/00* (2006.01)
*H05K 1/14* (2006.01)

(52) U.S. Cl.
CPC ............ *G02B 6/4281* (2013.01); *H01P 3/081* (2013.01); *H01P 5/028* (2013.01); *H05K 1/115* (2013.01); *H05K 1/181* (2013.01); *H05K 9/0024* (2013.01); *H05K 1/147* (2013.01); *H05K 2201/093* (2013.01); *H05K 2201/098* (2013.01); *H05K 2201/09272* (2013.01); *H05K 2201/09627* (2013.01); *H05K 2201/10121* (2013.01); *H05K 2201/10371* (2013.01)

(58) Field of Classification Search
CPC ......... H05K 2201/09627; H05K 1/147; H05K 2201/09272; H05K 2201/098; H05K 2201/10121; H05K 2201/10371; H01P 3/081; H01P 5/028; G02B 6/4279; G02B 6/4281; G02B 6/4277
See application file for complete search history.

(56) References Cited

U.S. PATENT DOCUMENTS

| | | | |
|---|---|---|---|
| 9,717,140 B2* | 7/2017 | Contreras | H05K 1/0224 |
| 10,187,971 B2* | 1/2019 | Hareyama | H05K 1/115 |
| 10,333,214 B2* | 6/2019 | Kushta | H01Q 1/523 |
| 10,390,424 B2* | 8/2019 | Ito | H05K 1/0243 |
| 10,418,708 B2* | 9/2019 | Sudo | H01Q 9/0414 |
| 2005/0098348 A1* | 5/2005 | Okumichi | H01L 23/552 174/262 |
| 2009/0133913 A1* | 5/2009 | Kushta | H05K 1/0222 174/260 |
| 2011/0298563 A1* | 12/2011 | Pai | H01P 1/20381 333/185 |
| 2012/0098627 A1* | 4/2012 | Kameya | H01P 1/20 333/204 |
| 2012/0269522 A1* | 10/2012 | Kagaya | H05K 1/0218 398/183 |
| 2013/0099876 A1* | 4/2013 | Kushta | H01P 1/20 333/134 |
| 2016/0336654 A1* | 11/2016 | Aoki | H01P 3/121 |
| 2017/0295644 A1* | 10/2017 | Wallash | H01P 1/203 |
| 2017/0318665 A1* | 11/2017 | Bois | H05K 1/0225 |
| 2019/0021164 A1* | 1/2019 | Bois | H05K 9/0039 |
| 2019/0306969 A1* | 10/2019 | Ishibashi | H05K 7/20436 |

* cited by examiner

PRINTED CIRCUIT BOARD, OPTICAL MODULE, AND OPTICAL TRANSMISSION EQUIPMENT

CROSS-REFERENCE TO RELATED APPLICATION

The present application claims priority from Japanese application JP2018-146067 filed on Aug. 2, 2018, the content of which is hereby incorporated by reference into this application.

BACKGROUND OF THE INVENTION

1. Field of the Invention

The present invention relates to a printed circuit board, an optical module, and an optical transmission equipment, and more particularly, to a printed circuit board in which unnecessary electromagnetic waves propagating to a differential transmission line of a microstrip line type are suppressed.

2. Description of the Related Art

In a printed circuit board, a differential transmission line for transmitting a serial data signal may be formed in some cases. Unnecessary high frequency electromagnetic noise may occur in such a differential transmission line.

In an optical module (optical transceiver) in the related art that is provided with a printed circuit board, by shielding space propagation of electromagnetic waves as much as possible by reducing a gap of metal cases corresponding to outer shells, and by attenuating the space propagation of the electromagnetic waves by arranging a electromagnetic wave absorbing material inside the cases, leakage of unnecessary electromagnetic waves from the optical transceiver has been suppressed. In addition, for such high frequency noise, a method of selectively inhibiting conduction propagation of a common mode signal component without having a bad influence on the differential signal component conducting and propagating the differential transmission line (without deteriorating the differential signal quality) has been proposed. WO 2011/004453 and JP 2012-227887 A disclose a configuration in which a resonator connected to a ground conductive layer through via holes in which a rectangular conductor film is disposed at the center thereof is configured, and the resonator is coupled by disposing the resonator below the differential transmission line. US 2011/0298563 A1 discloses a configuration in which a resonator is configured by providing a plurality of spiral opening portions (slots) in a ground conductive layer and disposing the opening portions on both sides of the differential transmission line to connect the opening portions on both sides with a line-shaped opening portion, and the resonator is coupled to the differential transmission line.

SUMMARY OF THE INVENTION

Out of the unnecessary electromagnetic noise, it is preferable to selectively inhibit conduction propagation of the unnecessary electromagnetic noise in the frequency domain including the frequency that becomes the common mode signal component of the differential transmission line, and thus, it is considered to couple a resonator structure to the differential transmission line.

In addition, in recent years, a high density arrangement of a plurality of components on a printed circuit board is desired. For this reason, the reduction of the region (area) of the resonator structure (resonance circuit) is desired while suppressing an increase in cost.

The present invention has been made in view of such problems, and an object of the present invention is to provide a printed circuit board, an optical module, and an optical transmission equipment, which realize selective inhibition of conduction propagation of a common mode signal component to a differential transmission line among unnecessary electromagnetic noise and enable high-density arrangement of differential transmission lines while suppressing an increase in cost.

(1) According to an aspect of the present invention, there is provided a printed circuit board including: a pair of strip conductors that are arranged in a first layer and extend to be aligned along a first direction; a first resonance conductor plate that is arranged in a second layer located below the first layer, overlaps, with a first portion of the pair of strip conductors, which has a first length along the first direction, in plan view, and extends further outward from each outer edge of the first portion of the pair of strip conductors along a second direction intersecting the first direction; a ground conductive layer that arranged in the second layer and includes an opening portion surrounding the first resonance conductor plate without being in contact with the first resonance conductor plate; a second resonance conductor plate that is arranged in a third layer located below the second layer, overlaps so as to be included in the first resonance conductor plate in plan view, and extends in the first direction along the center line of the pair of strip conductors; a third resonance conductor plate that is arranged in a fourth layer located below the third layer and overlaps so as to include the first resonance conductor plate in plan view; a plurality of first via holes that connect the first resonance conductor plate and the second resonance conductor plate; a second via hole that connects the second resonance conductor plate and the third resonance conductor plate; and a plurality of third via holes that connect the third resonance conductor plate and the ground conductive layer, in which a polygon obtained by sequentially connecting centers of two adjacent third via holes among the plurality of third via holes overlaps so as to include the first resonance conductor plate in plan view, and a center-to-center distance between the two adjacent third via holes among the plurality of third via holes is 0.5 wavelength or less at a frequency corresponding to a bit rate of a digital modulation signal to be transmitted.

(2) In the printed circuit board according to (1), the first resonance conductor plate may have a shape that is substantially line-symmetrical with respect to the centerline of the pair of strip conductors.

(3) In the printed circuit board according to (1) or (2), the second resonance conductor plate may have a shape that is substantially line-symmetrical with respect to the centerline of the pair of strip conductors.

(4) The printed circuit board according to any one of (1) to (3) may further include: a plurality of pairs of strip conductors that are arranged in the first layer and aligned in order along the second direction; a plurality of first resonance conductor plates that are arranged in the second layer and aligned in order along the second direction; a plurality of second resonance conductor plates that are arranged in the third layer and aligned in order along the second direction, and overlap so as to be included in the corresponding first resonance conductor plate in plan view; a plurality of first via holes that respectively connect the plurality of first resonance conductor plates and the corresponding plurality of second resonance conductor plates; and a plurality of second via holes that respectively connect the plurality of second resonance conductor plates and the third resonance conductor plate, in which the ground conductive layer may include a plurality of opening portions surrounding each of the plurality of first resonance conductor plates without being in contact with the plurality of first resonance conductor plates, the third resonance conductor plate overlaps so as to include the plurality of first resonance conductor plates in plan view, a polygon obtained by sequentially connecting centers of the two adjacent third via holes among the third via holes which are a part of the plurality of third via holes overlaps so as to include the corresponding first resonance conductor plate in plan view, and the center-to-center distance between the two adjacent third via holes among the plurality of third via holes may be 0.5 wavelength or less at a frequency corresponding to the bit rate of the digital modulation signal to be transmitted.

(5) In the printed circuit board according to any one of (1) to (4), an angle between the first direction and the second direction may be 85° or more and 90° or less.

(6) In the printed circuit board according to any one of (1) to (5), the first direction and the second direction may be substantially perpendicular to each other.

(7) According to an aspect of the present invention, there is provided an optical module including the printed circuit board according to any one of (1) to (6), wherein the printed circuit board further includes an IC that drives the digital modulation signal.

(8) The optical module according to (7) may further include a metal case which covers the printed circuit board to configure an electromagnetic shield and includes an opening portion for exposing a part of the printed circuit board to the outside.

(9) According to an aspect of the present invention, there is provided an optical transmission equipment on which the optical module according to (7) or (8) is mounted.

(10) According to an aspect of the present invention, there is provided an optical transmission equipment including the printed circuit board according to anyone of (1) to (6), wherein the printed circuit board further includes an IC that drives the digital modulation signal.

According to the present invention, it is possible to provide a printed circuit board, an optical module, and an optical transmission equipment, which realize selective inhibition of conduction propagation of a common mode signal component to a differential transmission line among unnecessary electromagnetic noise and enable high-density arrangement of differential transmission lines while suppressing an increase in cost.

DETAILED DESCRIPTION OF THE INVENTION

Figure 1:
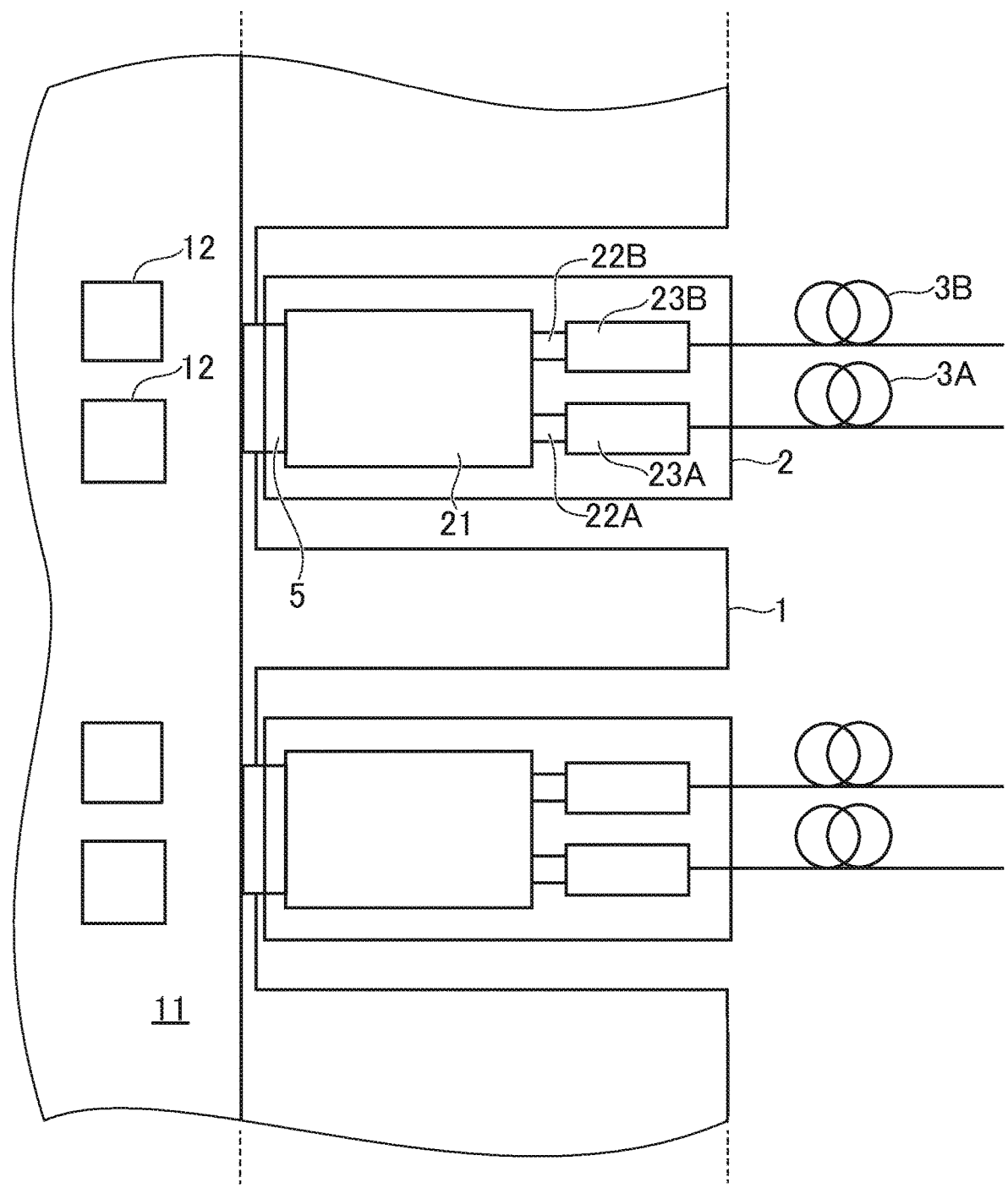
FIG. 1 is a schematic view illustrating a configuration of an optical transmission equipment and an optical module according to a first embodiment of the present invention.

Hereinafter, embodiments of the present invention will be described specifically and in detail with reference to the drawings. In all the drawings for describing the embodiments, the same reference numerals are given to the members having the same function, and the repeated description thereof will be omitted. The drawings illustrated below merely illustrate examples of the embodiments, and the sizes of the drawings and the scales described in the embodiments do not necessarily coincide with each other.

First Embodiment

FIG. 1 is a schematic view illustrating a configuration of an optical transmission equipment 1 and an optical module 2 according to a first embodiment of the present invention. The optical transmission equipment 1 includes a printed circuit board 11. The optical module 2 includes a printed circuit board 21. A printed circuit board according to the first embodiment is one or both of the printed circuit boards 11 and 21.

The optical transmission equipment 1 further includes an IC 12. The optical transmission equipment 1 is, for example, a large-capacity router or a switch. The optical transmission equipment 1 has, for example, a function of a switching equipment, and is disposed in a base station or the like. The optical transmission equipment 1 acquires data for receiving (electric signal for receiving) from the optical module 2, determines to transmit what data to where using the IC 12 or the like, generates data for transmitting (electric signal for transmitting), and transmits the data to the corresponding optical module 2 through the printed circuit board 11.

The optical module 2 is a transceiver having a function of optical transmitting and a function of optical receiving. The optical module 2 includes a ROSA 23A which converts an optical signal received through an optical fiber 3A into an electric signal, and a TOSA 23B which converts an electric signal into an optical signal and transmits the optical signal to an optical fiber 3B. The printed circuit board 21 is connected to the ROSA 23A and the TOSA 23B through flexible printed circuits 22A and 22B (FPC), respectively. An electric signal is transmitted from the ROSA 23A to the printed circuit board 21 through the flexible printed circuits 22A, and an electric signal is transmitted from the printed circuit board 21 to the TOSA 23B through the flexible printed circuits 22B. The optical modules 2 and the optical transmission equipment 1 are connected to each other through electrical connectors 5. The ROSA 23A and the TOSA 23B are electrically connected to the printed circuit board 21 and convert an optical/electric signal into an electric/optical signal.

A transmission system according to the first embodiment includes two or more of the optical transmission equipments 1, two or more of the optical modules 2, and one or more of optical fibers 3 (not shown in FIG. 1: for example, the optical fibers 3A and 3B). One or more of the optical modules 2 are connected to each optical transmission equipment 1. The optical fiber 3 is connected between the optical modules 2 mounted on the two optical transmission equipments 1, respectively. Transmitting data generated by one of the two optical transmission equipments 1 is converted into an optical signal by the mounted optical module 2, and such an optical signal is transmitted to the optical fiber 3. The optical signal transmitted over the optical fiber 3 is received by the optical module 2 mounted on the other of the two optical transmission equipments 1, and the optical module 2 converts the optical signal into an electric signal and transmits the electric signal to the other of the two optical transmission equipments 1 as receiving data.

Here, the bit rate of the electric signal transmitted/received by each optical module 2 is of 100 Gbit/s class, and the optical module 2 is a multi-channel system including 4 channels for transmission and 4 channels for reception. The bit rate of the electric signal transmitted on each channel is in a range of 25 Gbit/s to 28 Gbit/s. Here, the bit rate of the electric signal transmitted on each channel is 25.78 Gbit/s. The differential transmission line is used for propagating an electrical serial data signal with a bit rate of 25.78 Gbit/s.

Figure 2:
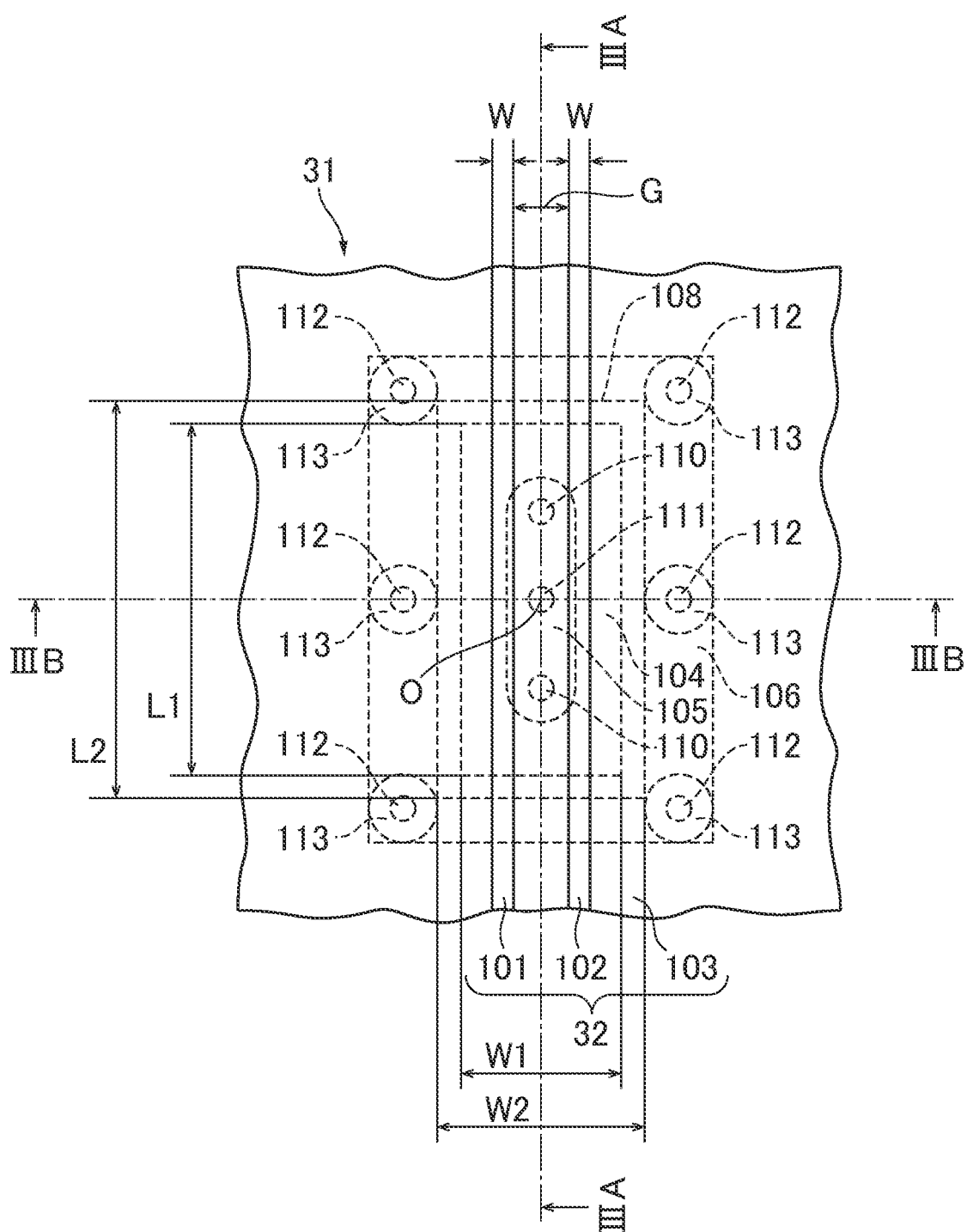
FIG. 2 is a schematic view illustrating a plane of a part of a printed circuit board according to the first embodiment of the present invention.
Figure 3A:
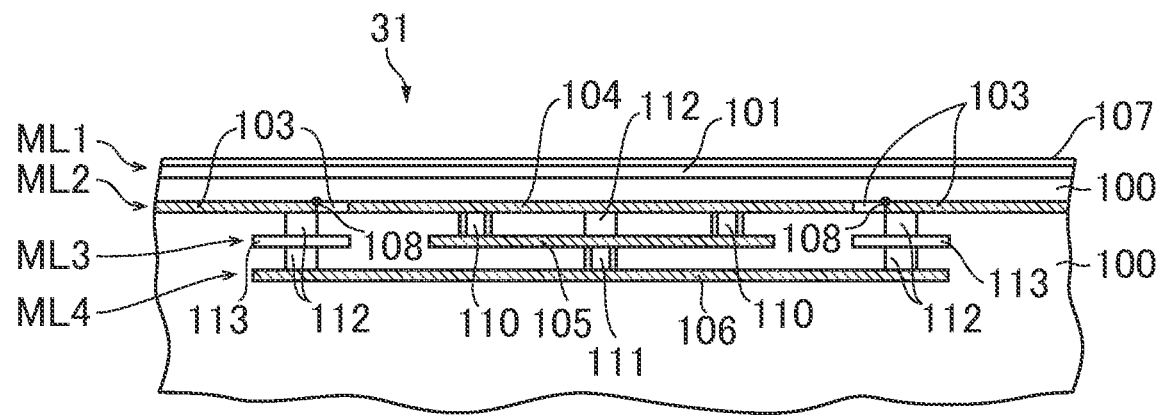
FIG. 3A is a schematic view illustrating a cross-section of a part of the printed circuit board according to the first embodiment of the present invention.
Figure 3B:
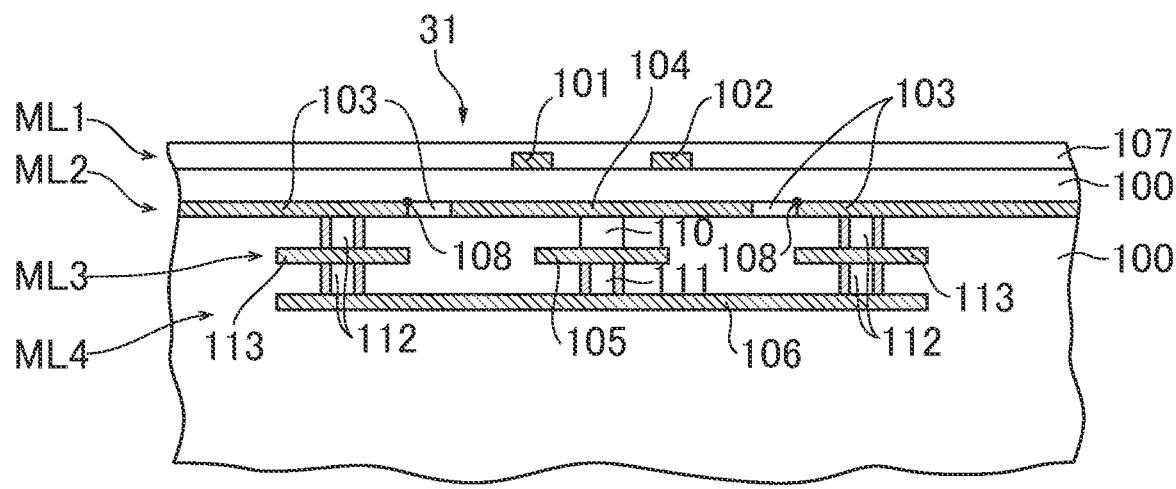
FIG. 3B is a schematic view illustrating a cross-section of a part of the printed circuit board according to the first embodiment of the present invention.

FIG. 2 is a schematic view illustrating a plane of a part of a printed circuit board 31 according to the embodiment. FIGS. 3A and 3B are schematic views each illustrating a cross-section of apart of the printed circuit board 31 according to the embodiment. FIGS. 2, 3A, and 3B schematically illustrate a plane and cross sections, respectively, in order to understand the structure of the printed circuit board 31 and are different from the actual plan view and cross-sectional views. The printed circuit board 31 is a printed wiring board having a multilayer structure in which a plurality of conductive layers are formed through dielectric layers respectively, and FIGS. 2, 3A and 3B illustrate, in the multilayer structure of the printed circuit board 31, one region of the differential transmission line and a portion (four conductive layers) in which the resonator structure is formed. A differential transmission line 32 is commonly used as a signal line of a digital modulation signal. FIG. 3A illustrates a cross-section taken along line IIIA-IIIA illustrated in FIG. 2, and FIG. 3B illustrates a cross-section taken along line IIIB-IIIB illustrated in FIG. 2.

The printed circuit board 31 according to the embodiment includes a plurality of differential transmission lines for high-speed digital signals, and the printed circuit board 31 includes a plurality of channels. FIGS. 2, 3A, and 3B illustrate one differential transmission line 32 (one channel) among the plurality of differential transmission lines. Here, the bit rate of the electric signal transmitted on the differential transmission line 32 is 25.78 Gbit/s. In addition, here, although the printed circuit board 31 is the printed circuit board 21 of the optical module 2, the printed circuit board 31 may be the printed circuit board 11 of the optical transmission equipment 1 as described above.

As illustrated in FIGS. 2, 3A, and 3B, the printed circuit board 31 includes a dielectric layer 100, a pair of strip conductors 101 and 102, a ground conductive layer 103, a first resonance conductor plate 104, a second resonance conductor plate 105, a third resonance conductor plate 106, a plurality (here, a pair) of first via holes 110, a second via hole 111, a plurality (here, six) of third via holes 112 and a plurality of lands 113. Although a protective dielectric film 107 is arranged over the entire surface on the top surface illustrated in FIG. 2, the protective dielectric film 107 is omitted in order to facilitate understanding of the multilayer structure of the printed circuit board 31. The protective dielectric film 107 is a dielectric film for solder adhesion prevention called a solder resist and has a thickness of about 40 μm. Similarly, the dielectric layer 100 is not illustrated in FIG. 2. In addition, in the cross sections of FIGS. 3A and 3B, although the dielectric layer 100 is arranged, in order to facilitate understanding of the multilayer structure of the printed circuit board 31, the cross-sectional portion where the protective dielectric film 107 and the dielectric layer 100 are arranged is not hatched, and members arranged at the back from the cross section (forward side penetrating the paper) are illustrated.

As described above, in FIGS. 2, 3A and 3B, four conductive layers of the multilayer structure of the printed circuit board 31 are illustrated. In order downward from the upper surface of the printed circuit board 31, the four conductive layers are a first metal layer ML1 (first layer), a second metal layer ML2 (second layer), third metal layer ML3 (third layer), and a fourth metal layer ML4 (fourth layer). In addition, although the stacking direction is set as "downward" here for the convenience, the stacking direction may be any direction as long as the four conductive layers are arranged in order along the stacking direction. The pair of strip conductors 101 and 102 are arranged in the first metal layer ML1 and are copper foils having a thickness of 37 μm. The ground conductive layer 103 and the first resonance conductor plate 104 are both arranged in the second metal layer ML2 and are copper foils having a thickness of 32 μm. The second resonance conductor plate 105 and the lands 113 are all arranged in the third metal layer ML3 and are copper foils having a thickness of 32 μm. The third resonance conductor plate 106 is arranged in the fourth metal layer ML4 and is a copper foil having a thickness of 32 μm. The interlayer distance between the first metal layer ML1 and the second metal layer ML2 (the distance between the lower surface of the first metal layer ML1 and the upper surface of the second metal layer ML2), the interlayer distance between the second metal layer ML2 and the third metal layer ML3, and the interlayer distance between the third metal layer ML3 and the fourth metal layer ML4 are all set to 75 μm. The planar shape of each conductive layer is processed and formed by patterning.

A material (glass epoxy resin) made of a glass-cloth base and an epoxy resin is used for the dielectric layer 100. For example, the relative dielectric constant of the dielectric layer 100 is set to 3.5. In the multilayer structure of the printed circuit board 31, the dielectric layers 100 are respectively arranged between adjacent conductive layers. In addition, in the planar shape of each conductive layer, the dielectric layer 100 is arranged between two members arranged to be separated from each other.

The pair of strip conductors 101 and 102 are arranged in the first layer (first metal layer ML1) and both extend to be aligned along a first direction (vertical direction shown in FIG. 2). The width W of each of the pair of strip conductors 101 and 102 is 0.09 mm, and the gap G is 0.23 mm. Here, the gap G is the distance from the inner edge of the strip conductor 101 to the inner edge of the strip conductor 102. It is preferable that the pair of strip conductors 101 and 102 extend in a linear shape in parallel with each other in the first direction with a width W while being separated by the gap G from each other. However, in some cases, the shape of the pair of strip conductors 101 and 102 may be considered to be bent depending on the relationship with other components mounted on the printed circuit board 31. Even in such a case, it is sufficient if the pair of strip conductors 101 and 102 have a linear shape in parallel with each other in the region facing the first resonance conductor plate 104 and the region in the vicinity thereof.

Figure 4A:
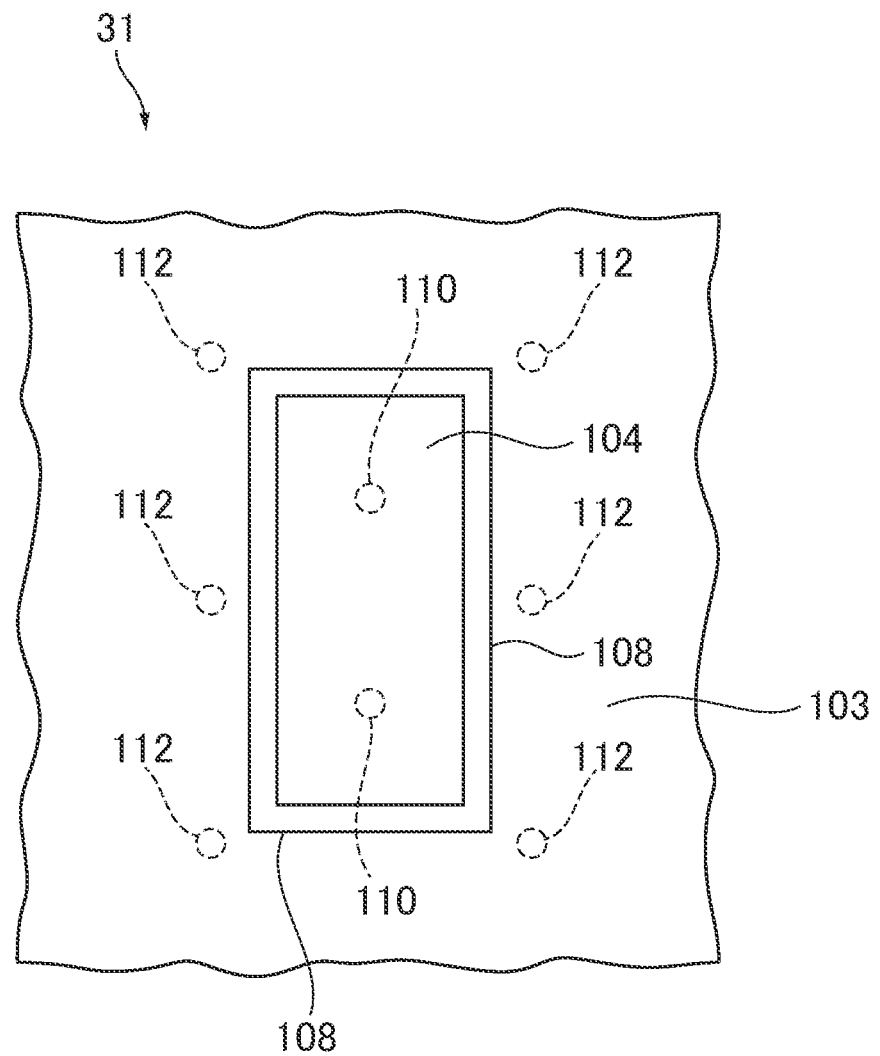
FIG. 4A is a schematic view illustrating a configuration of a second conductive layer in a multilayer structure of the printed circuit board according to the first embodiment of the present invention.

FIG. 4A is a schematic view illustrating a configuration of a second conductive layer in the multilayer structure of the printed circuit board 31 according to the embodiment. The first resonance conductor plate 104 is arranged in the second layer (the second metal layer ML2), and the first resonance conductor plate 104 overlaps with first portions of the pair of strip conductors 101 and 102 having a first length L1 along the first direction in plan view and further spreads outward from the outer edge of each of the first portions along a second direction (horizontal direction shown in FIGS. 2 and 4A). Here, as illustrated in FIG. 2, the first portions of the pair of strip conductors 101 and 102 are portions overlapping with the first resonance conductor plate 104 in plan view, and the length along the first direction is the first length L1. In addition, here, the first resonance conductor plate 104 has a rectangular shape, and the first length L1 is 1.6 mm, with the first direction being set as the longitudinal direction. The first width W1 is 0.7 mm, with the second direction being set as the lateral direction. The first resonance conductor plate 104 preferably has a shape which is substantially line-symmetrical with respect to the centerline of the pair of strip conductors 101 and 102 and further preferably has a shape which is ideally line-symmetrical. In addition, here, although the first resonance conductor plate 104 has a rectangular shape, the present invention is not limited thereto. The second direction is a direction intersecting the first direction, but the angle between the first direction and the second direction is preferably 85° or more and 90° or less, and the first direction and the second direction are more preferably substantially perpendicular (with an angle of 90°). In the embodiment, the first direction (vertical direction in FIG. 2) and the second direction (horizontal direction in FIG. 2) are perpendicular to each other. The center of the rectangular shape of the first resonance conductor plate 104 is indicated by O. The center O is located at a distance of half of the first length L1 from both ends along the first direction and at a distance of half of the first width W1 from both ends along the second direction. In addition, although the first resonance conductor plate 104 and the second resonance conductor plate 105 are connected by the pair of first via holes 110, the first via holes 110 are illustrated with dashed lines in FIG. 4A. In order to clarify the positional relationship thereof. In addition, the third via holes 112 are respectively arranged above the six lands 113, but, the six third via holes 112 (arranged above the lands 113) are illustrated with dashed lines in FIG. 4A in order to clarify the positional relationship thereof.

The ground conductive layer 103 is arranged in the second layer (second metal layer ML2) and has an opening portion 108 surrounding the first resonance conductor plate 104 without being in contact with the first resonance conductor plate 104. The opening portion 108 denotes a region where the ground conductive layer 103 is not formed. Here, the opening portion 108 has a rectangular shape, a second length L2 along the first direction is 1.8 mm, and a second width W2 along the second direction is 0.9 mm (refer to FIG. 2). The ground conductive layer 103 is separated by a gap of 0.1 mm from the first resonance conductor plate 104. With the exception of the opening portion 108, the ground conductive layer 103 is formed to extend outward from both sides of the pair of strip conductors 101 and 102 in addition to the region facing the pair of strip conductors 101 and 102. Therefore, the differential transmission line 32 of a microstrip line type is configured to include the pair of strip conductors 101 and 102, the ground conductive layer 103, and the dielectric layer 100. Here, the characteristic impedance in the differential mode can be 100 Ω.

Figure 4B:
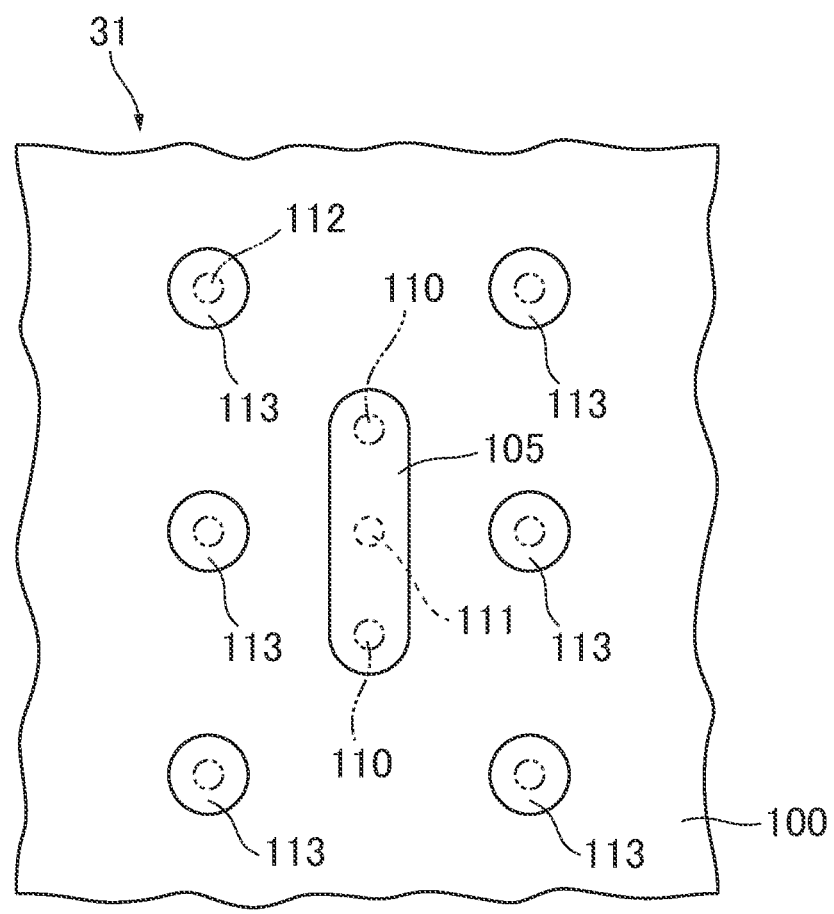
FIG. 4B is a schematic view illustrating a configuration of a third conductive layer in the multilayer structure of the printed circuit board according to the first embodiment of the present invention.

FIG. 4B is a schematic view illustrating a configuration of the third conductive layer in the multilayer structure of the printed circuit board 31 according to the embodiment. The second resonance conductor plate 105 is arranged in the third layer (third metal layer ML3), overlaps so as to be included in the first resonance conductor plate 104 in plan view, and extends in a first direction (vertical direction in FIG. 4B) along the center line of the pair of strip conductors 101 and 102. The second resonance conductor plate 105 has a shape extending in the first direction along the center line of the pair of strip conductors 101 and 102, and the second resonance conductor plate 105 is included in the first resonance conductor plate 104 in plan view. The first resonance conductor plate 104 spreads further outward from the edge of the second resonance conductor plate 105 in plan view. Here, the second resonance conductor plate 105 has a shape that semi-circles with a radius of 0.15 mm are added to both ends (both ends along the first direction) of a rectangular shape with a length of 0.8 mm along the first direction and a width of 0.3 mm along the second direction. The second resonance conductor plate 105 preferably has a shape that is substantially line-symmetrical with respect to the centerline of the pair of strip conductors 101 and 102, and more preferably has a shape that is ideally line-symmetrical. In addition, also with respect to the arrangement along the first direction, the midpoint of both ends of the second resonance conductor plate 105 along the first direction is preferably in the vicinity of the center O in plan view, more preferably substantially coincident with the center O. The pair of first via holes 110 are arranged above the second resonance conductor plate 105, but the pair of first via holes 110 are illustrated by two-dot dashed lines in FIG. 4B in order to clarify the positional relationship. Although the second resonance conductor plate 105 is connected to the third resonance conductor plate 106 through the second via hole 111, the second via hole 111 is illustrated by dashed lines in FIG. 4B in order to clarify the positional relationship. In addition, the third via holes 112 are arranged above and below each of the six lands 113, but the six third via holes 112 (arranged above the lands 113) are illustrated by two-dot dashed lines in FIG. 4B in order to clarify the positional relationship.

Figure 4C:
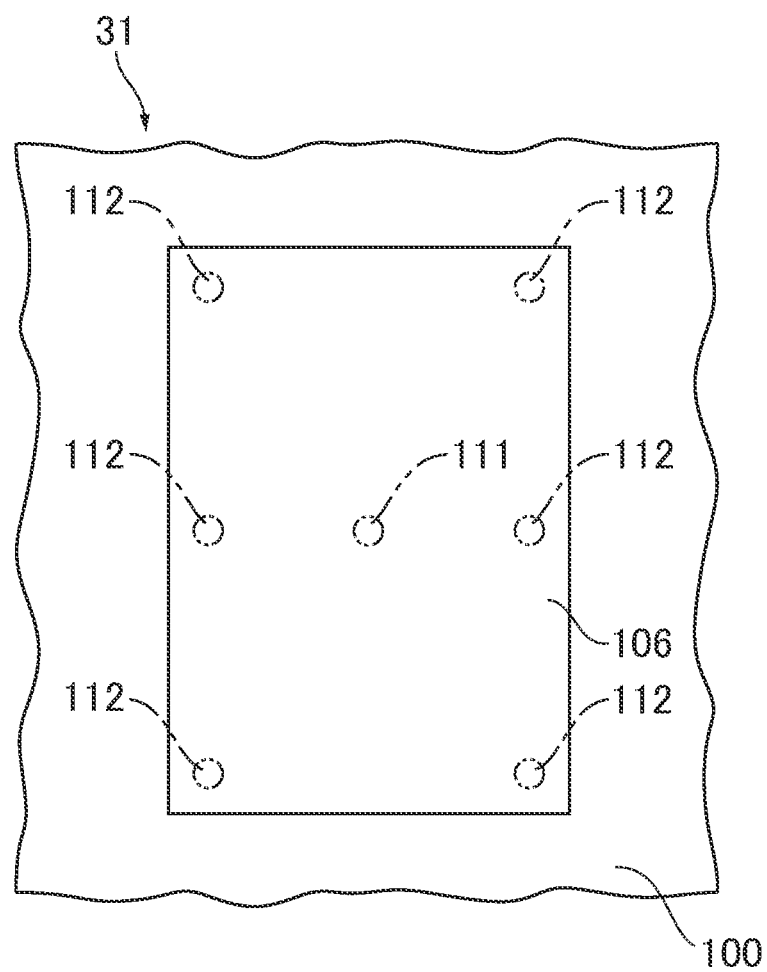
FIG. 4C is a schematic view illustrating a configuration of a fourth conductive layer in the multilayer structure of the printed circuit board according to the first embodiment of the present invention.

FIG. 4C is a schematic view illustrating a configuration of the fourth conductive layer in the multilayer structure of the printed circuit board 31 according to the embodiment. The third resonance conductor plate 106 is arranged in the fourth layer (fourth metal layer ML4) and overlaps so as to include the first resonance conductor plate 104 in plan view. The third resonance conductor plate 106 has a rectangular shape that has a length of 2.2 mm along the first direction and a width of 1.5 mm along the second direction. For the arrangement of the third resonance conductor plate 106, the center of the rectangular shape of the third resonance conductor plate 106 is preferably to be close to the center O, and more preferably to be substantially coincident with the center O. In order to clarify the positional relationship, the second via hole 111 and the six third via holes 112 (arranged below the lands 113) are illustrated by two-dot dashed lines in FIG. 4C.

The pair of first via holes 110 connect the first resonance conductor plate 104 and the second resonance conductor plate 105. The second via hole 111 connects the second resonance conductor plate 105 and the third resonance conductor plate 106. The plurality of third via holes 112 connect the third resonance conductor plate 106 and the ground conductive layer 103. In the multilayer structure of the printed circuit board 31, adjacent conductive layers are electrically connected by via holes (vias). All the via holes according to the embodiment are realized by laser vias (LVH). In the laser via, by drilling a fine hole with a laser at predetermined positions of the dielectric layer 100 arranged between the adjacent conductive layers and performing copper plating on the inner side of the hole, the adjacent conductive layers are electrically connected to each other. In the embodiment, all the via holes have a cylindrical shape with a diameter of 0.1 mm. The via hole according to the embodiment is plated with copper on the side of the hole and is formed to be hollow. However, the present invention is not limited thereto, and the hole may be buried with copper. That is, the cylindrical shape of the via hole may be hollow or solid. In addition, the conductor arranged in the via hole is not limited to copper, and another metal or a conductor other than metal may be employed.

The pair of first via holes 110 are arranged at the centers of semicircles at both ends of the second resonance conductor plate 105 in plan view. Therefore, the center-to-center distance between the pair of first via holes 110 is 0.8 mm. The pair of first via holes 110 are preferably near both ends of the second resonance conductor plate 105 extending in the first direction. In addition, it is more preferable that the first via holes 110 are substantially line-symmetrical with respect to the second direction penetrating the center O. One second via hole 111 is arranged at the center (center O) of the second resonance conductor plate 105 in plan view. The second via hole 111 is preferably to be close to the center O in plan view, and more preferably to be coincident with the center O.

A polygon obtained by sequentially connecting the centers of two adjacent third via holes 112 among a plurality of (here, six) third via holes 112 overlaps so as to include the first resonance conductor plate 104 in plan view. In the embodiment, the six third via holes 112 are arranged to surround the first resonance conductor plate 104 in plan view. A polygon obtained by sequentially connecting the centers of the two adjacent third via holes 112 among the six third via holes 112 is substantially a rectangle and overlaps to include the first resonance conductor plate 104 in plan view. The length of the rectangle along the first direction is 1.9 mm, and the width along the second direction is 1.2 mm. The center-to-center distance between the two adjacent third via holes 112 is 0.95 mm in the first direction, and the center-to-center distance is 1.2 mm in the second direction. The plurality of third via holes 112 connect the third resonance conductor plate 106 (fourth layer) and the ground conductive layer 103 (second layer) and are configured with two stages of laser vias. In the third layer, as illustrated in FIG. 4B, a plurality of (here, six) lands 113 are arranged, each third via hole 112 has a two-stage structure, and the stages are arranged on the upper portion (above) and the lower portion (below) of the corresponding land 113, respectively. The diameter of each land 113 is 0.3 mm. The land 113 is a circular conductive plate arranged in the third layer, and has a function of relaying the connection of the third via hole 112 configured with two stages of laser vias.

The center-to-center distance between the two adjacent third via holes 112 among the plurality of third via holes 112 is 0.5 wavelength or less at a frequency corresponding to the bit rate of the digital modulation signal to be transmitted. In the embodiment, the plurality of third via holes are buried in the dielectric layer 100 having a relative dielectric constant εr of 3.5. The wavelength shortening coefficient ($1/\sqrt{\varepsilon r}$) of the dielectric layer 100 in a vacuum is 0.535. One wavelength λg in the dielectric layer 100 at a frequency of 25.78 GHz corresponding to the bit rate of the digital modulation signal to be transmitted is calculated as 6.22 mm. Therefore, the maximum value of the center-to-center distance between the two adjacent third via holes 112 among the six third via holes 112 is 1.2 mm. The length of 1.2 mm is 0.19 λg in units of wavelength λg, which is sufficiently smaller than 0.5 λg. The first to third resonance conductor plates and the first to third via holes constitute a resonator. Due to the resonator structure, it is possible to sufficiently suppress the leakage of the generated electromagnetic noise to the outside, and thus, it is possible to improve the resonance characteristic.

Figure 5:
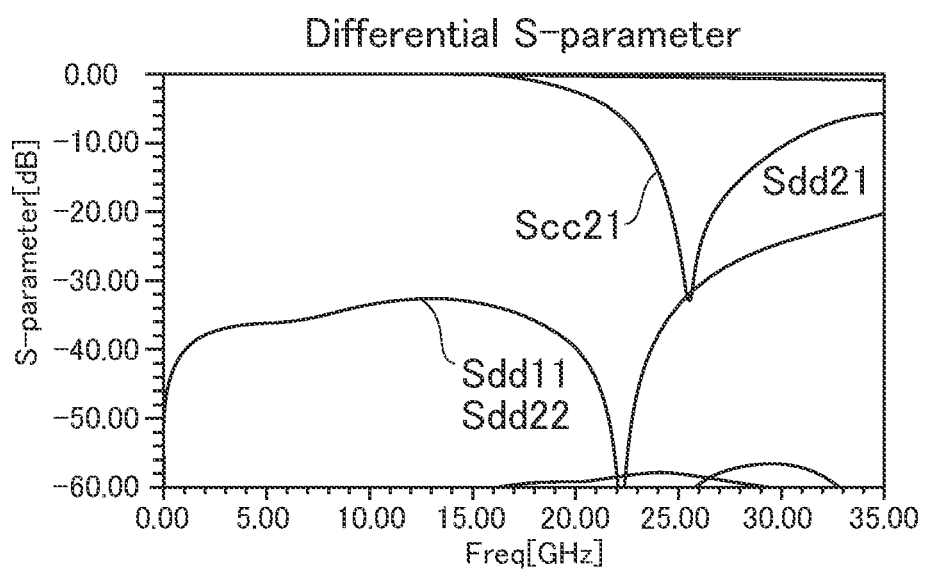
FIG. 5 is a graph illustrating characteristics of a differential transmission line according to the first embodiment of the present invention.

FIG. 5 is a view illustrating characteristics of the differential transmission line 32 according to the embodiment. The characteristics are calculated by using a three-dimensional electromagnetic field analysis tool. The length of the pair of strip conductors 101 and 102 along the first direction is set to 14 mm, including the first portion (the portion intersecting the resonator structure). As illustrated in FIG. 5, although the resonator structure (resonance circuit) is allowed to intersect the differential transmission line 32, there is almost no deterioration of the differential mode reflection characteristics (Sdd11 and Sdd22), and a very good value of −30 dB or less is maintained in a frequency range of 0 to 26 GHz. This is an effect obtained by arranging the first resonance conductor plate 104 in the same layer (second layer) as the ground conductive layer 103 and forming the shape of the first resonance conductor plate 104 and the shape of the second resonance conductor plate 105 to be substantially line-symmetrical with respect to the centerline of the pair of strip conductors 101 and 102. In addition, the differential mode passage characteristics (Sdd21) also exhibit good characteristics. On the other hand, in the common mode passage characteristics (Scc21), an attenuation region centered on a frequency of 25.8 GHz is generated, and the conduction propagation of the common mode signal component with a frequency of 25.78 GHz can be inhibited by 30 dB or more. These attenuation characteristics are characteristics obtained by configuring a resonator structure including the first to third resonance conductor plates and the first to third via holes, which are arranged inside the dielectric layer 100.

Figure 6:
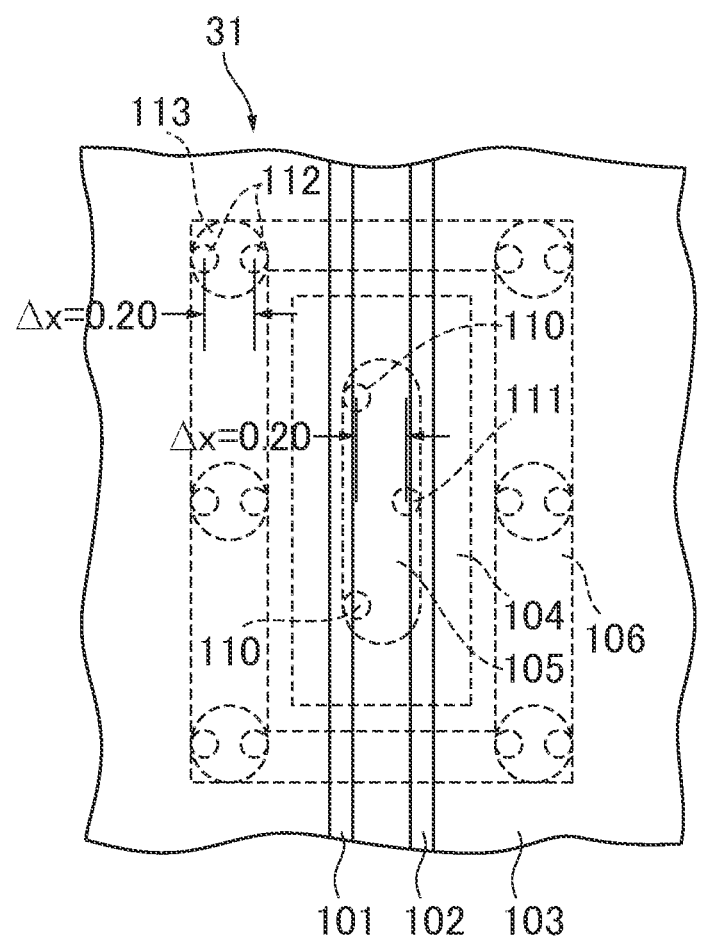
FIG. 6 is a schematic view illustrating a plane of a part of another example of the printed circuit board according to the first embodiment of the present invention.

FIG. 6 is a schematic view illustrating a plane of a part of another example of the printed circuit board 31 according to the embodiment. In consideration of the manufacturing variation that may occur in the process of manufacturing the printed circuit board 31, the influence of the manufacturing variation on the attenuation characteristics of the common mode signal component will be described. In the process of manufacturing the printed circuit board 31, in the process of manufacturing the multilayer structure of the printed circuit board 31, a patterning process of each of the plurality of conductive layers (copper foils) and a drilling process of the laser vias for forming the respective via holes are respectively performed by using different manufacturing apparatuses. Therefore, since a certain degree of shift occurs between the positions of the patterns of the conductive layers (copper foils) and the positions of the via holes, it is necessary to allow the shift. In view of the processing accuracy in the drilling process of the laser vias, although the maximum value of the allowable shift depends on the conditions of the process of manufacturing the printed circuit board 31, in order to increase the manufacturing yield and to reduce the manufacturing cost, for example, a positional shift from a design center value is preferably a maximum of ±0.10 mm in the x direction and a maximum of ±0.10 mm in the y direction. The diameter of the land 113 is 0.3 mm due to the maximum value of the shift, which is based on the relationship between the diameter of 0.1 mm of the laser vias (first to third via holes) and the allowable shift. Even if the position of the laser via and the pattern of the conductive layer (copper foil) are relatively shifted, the laser via is set not to protrude from the land 113.

The printed circuit board 31 illustrated in FIG. 6 indicates shifted positions of the via holes where the influence on the attenuation characteristics of the common mode signal component is maximized within the range of allowable positional shift. In FIG. 6, when the right direction in the second direction (horizontal direction) is set as the +x direction, the center positions of the first via holes 110 which are laser vias connecting the second layer and the third layer, and the center positions of the upper portions of the third via holes 112 which are laser vias connecting the second layer and the third layer are shifted by 0.10 mm (x=−0.10 mm) in the −x direction from the center position illustrated in FIG. 2. In addition, the center position of the second via hole 111 which is a laser via connecting the third layer and the fourth layer and the center positions of the lower portion of the third via holes 112 which are laser vias connecting the third layer and the fourth layer are shifted by 0.10 mm (x=+0.10 mm) in the +x direction from the center position illustrated in FIG. 2. The relative shift amount Δx between the laser vias connecting the second layer and the third layer and the laser vias connecting the third layer and the fourth layer is 0.20 mm. Similarly, as an example in which the relative shift amount Δx is 0.20 mm, even when the shift of the laser vias connecting the second layer and the third layer is set to 0.10 mm (x=+0.10 mm) in the +x direction and the shift of the laser vias connecting the third layer and the fourth layer is set to 0.10 mm (x=−0.10 mm) in the −x direction, the positions of the laser vias illustrated in FIG. 6 are arranged in a left-right inverted manner, and thus, the same characteristics are obtained.

Figure 7:
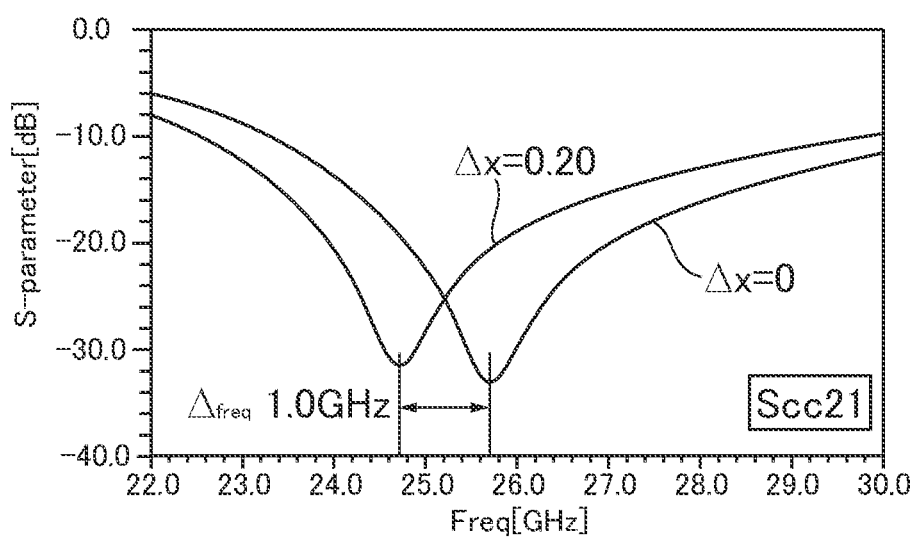
FIG. 7 is a view illustrating characteristics of another example of the differential transmission line according to the first embodiment of the present invention.

FIG. 7 is a view illustrating characteristics of another example of the differential transmission line 32 according to the embodiment. FIG. 7 illustrates a common mode passage characteristic (Scc21) according to another example (relative shift amount Δx=0.20 mm) together with the common mode passage characteristic (Scc21) according to the relative shift amount Δx=0 illustrated in FIG. 2. In another example (relative shift amount Δx=0.20 mm), the center frequency of the attenuation region is 24.8 GHz and is shifted to a frequency about 1.0 GHz lower than that of the example of the relative shift amount Δx=0 illustrated in FIG. 2. However, the conduction propagation of the common mode signal component with a frequency of 25.78 GHz can be inhibited by 20 dB or more. According to the study of the inventors, as the position of the via hole in the relative shift amount Δx=0 illustrated in FIG. 2 is moved in any direction of the plane by the first direction and the second direction, the center frequency of the attenuation region is changed to the lower side. It is considered that this phenomenon causes the inductance component in the via hole to substantially increase with the shift amount, and therefore, the resonance frequency of the resonator is lowered.

The printed circuit board 31 according to the embodiment can realize selective inhibition of only the conduction propagation of the common mode signal component to the differential transmission line in the electromagnetic noise while suppressing the deterioration of the conduction propagation of the differential signal component of the digital electric signal. Since the printed circuit board 31 according to the embodiment can be manufactured without adding a new step to the process of manufacturing the printed circuit board 31, the increase in cost is suppressed. In addition, regarding the positional shift of the via hole with respect to the conductive layer pattern that may occur when manufacturing the printed circuit board 31, a sufficient attenuation amount of 20 dB or more with respect to the common mode signal component can be obtained.

The optical modules (optical transceiver modules or optical transceivers) for optical fiber transmission have been speeded up, miniaturized, and cost-reduced with the spread of broadband networks in recent years, and with respect to the speeding up, currently, the optical modules with a bit rate of 100 Gbit/s have been widely used. With respect to the miniaturization and the cost reduction, the case volume has been reduced and the number of components has been reduced from CFP multi source agreement (MSA) standard to CFP 2, CFP 4, and QSFP 28 (each MSA standard).

In addition, in the optical transmission equipment (network equipment) on which the optical module is mounted, it is required to suppress the intensity of the unnecessary electromagnetic wave generated by the equipment to a limit value or less defined in the legal regulations. For example, in the United States, it is necessary to satisfy the limit value of 53.9 dB (µV/m) (Class B standard in a case where the distance is 3 m and the frequency range is 1 GHz to 40 GHz) or less defined in the "FCC Part 15 Subpart B" standard. In the optical modules, since the unnecessary electromagnetic waves are generated at high frequencies of GHz or higher due to switching noise of the embedded IC in many cases, the design technique to reduce the radiation of these unnecessary electromagnetic waves to the outside of the equipment is important to both of the optical transmission equipments and the optical modules.

In the optical module, the main excitation source of unnecessary electromagnetic waves is an IC (CDR, Driver, TIA, or the like) that amplifies and outputs an electrical serial data signal (modulated signal). Unlike a clock signal, since an ideal serial data signal does not include a repetitive signal pattern, the ideal serial data signal does not have a large peak intensity on the frequency spectrum. However, in the actual differential amplifier circuit inside the IC, switching noise occurs due to the non-linearity of the transistor, and when the frequency spectrum of the common mode signal component of the output signal is observed, a large peak occurs at the frequency corresponding to the bit rate. A part of the common mode signal component is propagated to space as radiation loss while conducting and propagating through the differential transmission line and the connector portion on the printed circuit board. In addition to this, in the optical module of 100 Gbit/s, since an electric serial data signal with a bit rate of 25.78 Gbit/s is used, an unnecessary electromagnetic wave with a frequency of 25.78 GHz corresponding to the bit rate is generated.

In recent years, the capacity of the optical transmission equipment (network equipment) has been increased, and thus, an LSI (FPGA) having a large power consumption (heat generation amount) is mounted. In the optical transmission equipment, a large number of air vents are arranged to enhance air cooling and blowing, and the shielding effect of the equipment tends to be low. A large number of optical modules of 100 Gbit/s class are also mounted on the optical transmission equipment. In the optical module in accordance with a major MSA standard, for example, QSFP28, a component for external connection is arranged on one end of the printed circuit board and is connected outside the metal case to a connector mounted on the optical transmission equipment. As a disadvantage due to this configuration, there is a problem that the unnecessary electromagnetic waves of the optical transmission equipment cannot be sufficiently suppressed mainly due to the unnecessary electromagnetic waves radiated from the differential transmission lines extracted from the metal case and the connector portion.

In the optical module in accordance with QSFP28, 4-channel differential transmission lines for transmission circuits and 4-channel differential transmission lines for reception circuits are required to be arranged on a small-sized printed circuit board with a board width of about 16 mm. In the related art, with respect to the size (length, width) of the resonators to be coupled to the differential transmission lines, a relatively large area has been required to obtain a desired resonance frequency, and according to the study of the inventors, it has been difficult to arrange the differential transmission lines on the printed circuit board of the optical transceiver in accordance with QSFP 28. However, the printed circuit board 31 according to the embodiment has a structure suitable for solving the problem.

In the embodiment, the pair of first via holes 110 are arranged at both end positions of the second resonance conductor plate 105 along the first direction to connect the first resonance conductor plate 104 and the second resonance conductor plate 105. However, the present invention is not limited thereto. For example, with respect to the first via holes, in addition to the pair of first via holes 110 arranged at both end positions of the second resonance conductor plate 105, the first via hole 110 may be provided at the position of the center O in plan view. In such a case, the change amount of the center frequency of the attenuation region according to the positional shift of the via hole can be reduced to about 0.86 GHz, and thus, it is possible to realize a common mode filter structure with a smaller variation in characteristics with respect to the manufacturing variations.

On the contrary, it has been considered that, when the number of first via holes is reduced from two to one, deterioration of characteristics occurs. For example, when one first via hole is provided at the center position (center O) of the second resonance conductor plate 105, according to the study of the inventors or the like, the change amount in the center frequency of the attenuation region according to the positional shift of the via hole is increased to 1.4 GHz, and the attenuation amount of the common mode signal component at a frequency of 25.78 GHz is reduced to about 15 dB. It is preferable that two or more first via holes are arranged.

In the embodiment, although the center-to-center distance between the pair of first via holes 110 is 0.8 mm, the present invention is not limited to the center-to-center distance. For example, when the center-to-center distance between the pair of first via holes 110 is increased to 1.13 mm, and accordingly, the shape of the second resonance conductor plate 105 is set to as a shape formed by adding semicircles with a radius of 0.15 mm to both ends of a rectangle with a length of 1.13 mm and a width of 0.3 mm, according to the study of the inventors of the present invention, by reducing the first length L1 of the shape the first resonance conductor plate 104 to 1.43 mm and reducing the second length L2 of the shape of the opening portion 108 of the ground conductive layer 103 to 1.63 mm, the resonance frequency of the resonator can be adjusted to a desired value, and the common mode passage characteristics (Scc21) can be substantially the same characteristics as FIG. 5.

In addition, in the embodiment, although the width of the second resonance conductor plate 105 is set to 0.3 mm, the width of the second resonance conductor plate is not limited thereto. In terms of avoiding unnecessary capacitive coupling with the ground conductive layer 103, the first resonance conductor plate 104 preferably has a first width W1 or less (0.7 mm or less). In accompany with the change of the width of the second resonance conductor plate 105, by adjusting the length of the second resonance conductor plate 105 along the first direction and the second length L2 of the opening portion 108 of the ground conductive layer 103, the resonance frequency of the resonator can be adjusted to a desired value.

In the embodiment, as the dielectric material layer 100, a material (glass epoxy resin) configured with a glass cloth base material and an epoxy resin is used. However, the present invention is not limited thereto, and a liquid crystal polymer (LCP) or a fluorine-based resin (PTFE: polytetrafluoroethylene) may be used.

Figure 8:
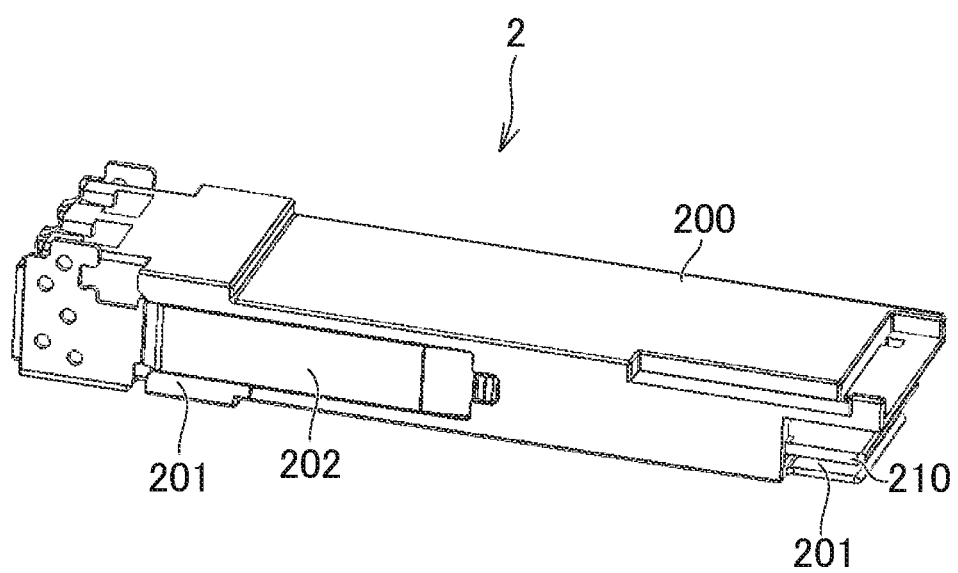
FIG. 8 is a schematic perspective view illustrating an external shape of the optical module according to the first embodiment of the present invention.
Figure 9:
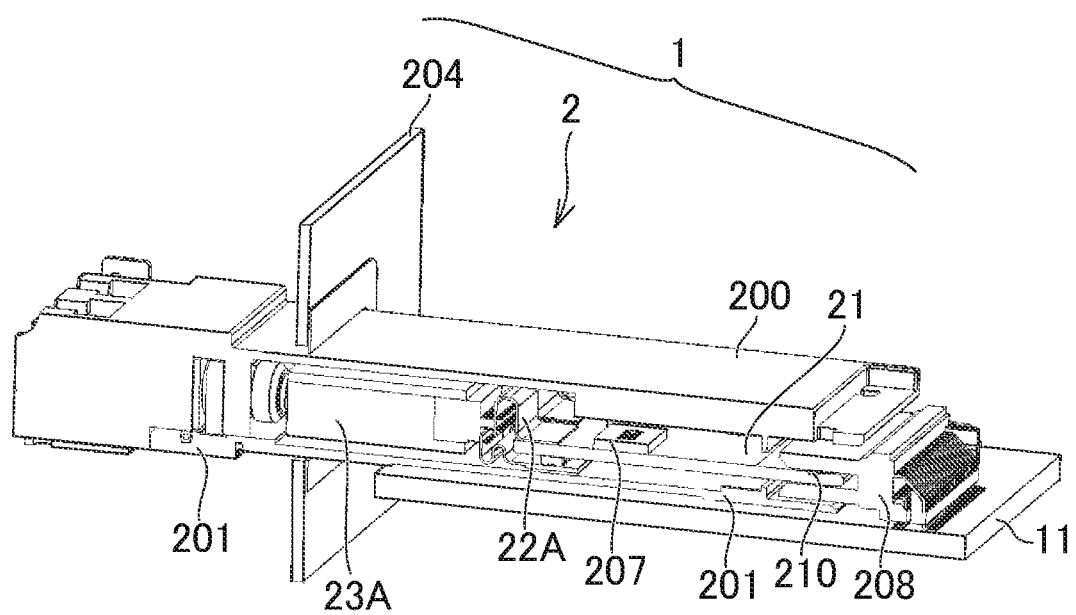
FIG. 9 is a schematic perspective view illustrating a structure of an optical module according to the first embodiment of the present invention.

FIG. 8 is a schematic perspective view illustrating the external shape of the optical module 2 according to the embodiment. FIG. 9 is a schematic perspective view illustrating the structure of the optical module 2 according to the embodiment. FIG. 9 illustrates a state in which the optical module 2 is mounted on the optical transmission equipment 1. Here, the printed circuit board 31 according to the embodiment is a printed circuit board 21.

The optical module 2 according to the embodiment is an optical module in accordance with the QSFP 28 (MSA standard). As illustrated in FIG. 8, the optical module 2 includes an upper case 200, a lower case 201, a latch 202, and a card edge connector 210. A metal such as zinc or aluminum is used as a material of the upper case 200 and the lower case 201, and a metal case is configured to include the upper case 200 and the lower case 201. The upper case 200 and the lower case 201 are in close contact with each other without a gap at portions other than the opening portion for passing the card edge connector 210 and cover the printed circuit board 21 to constitute an electromagnetic shield. That is, the metal case (upper case 200 and lower case 201) functions as an electromagnetic shield against radiation from the printed circuit board 21 inside the metal case. Although the metal case has an opening portion, the metal case functions sufficiently as an electromagnetic shield. On the other hand, the metal case does not have a function to prevent conduction propagation of the unnecessary noise component included in the output signal from the optical module to the optical transmission equipment, and the unnecessary electromagnetic waves can be radiated due to unnecessary noise components conducted and propagated to the differential transmission line and the connector site drawn out of the metal case through the opening portion. The card edge connector 210 is an end portion of the printed circuit board 21, and a plurality of contact terminals for connector connection are arranged in one line. The card edge connector 210 is exposed to the outside from the opening portion (slot opening portion) at the rear side (right side in FIG. 8) of the upper case 200 and the lower case 201 and has a hot plugging/unplugging function. In addition, the opening portion is provided in order to expose a part of the printed circuit board 21 to the outside.

FIG. 9 illustrates a state in which the optical module 2 is mounted on the optical transmission equipment 1, and in order to illustrate the internal structure of the optical module 2, a part of the upper case 200 and the lower case 201 is not displayed. In FIG. 9, a part of the printed circuit board 11 inside the optical transmission equipment 1 and a front panel 204 are illustrated. In addition, the printed circuit board 11 further includes a connector 208 in accordance with QSFP 28 (MSA standard), and the connector 208 is mounted on the printed circuit board 11. Inside the upper case 200 and the lower case 201 of the optical module 2, a receiver optical sub-assembly (ROSA) 23A, a transmitter optical sub-assembly (TOSA) 23B (not shown), and flexible printed circuits 22A and 22B (22B not shown) are mounted. The printed circuit board 21 includes a plurality of ICs. For example, a clock data recovery IC (CDR-IC) 207 on the reception side is mounted on the printed circuit board 21, and the CDR-IC 207 outputs a 4-channel differential digital modulation signal at a bit rate of 25.78 Gbit/s. This output signal is conducted and propagated to the printed circuit board 11 inside the optical transmission equipment 1 through the 4-channel differential transmission line 32 (not shown) arranged on the printed circuit board 21, the card edge connector 210, and the connector 208. The resonator structure illustrated in FIG. 2 is arranged in each of the four pairs of differential transmission lines 32 arranged on the printed circuit board 21.

When the output spectrum of the CDR-IC 207 is measured, an originally unnecessary clock noise component is observed as a single peak at a frequency of 25.78 GHz corresponding to the bit rate. However, by arranging the resonator structure illustrated in FIG. 2 in each of the four-channel differential transmission lines 32, the conduction propagation of the common mode signal component at a frequency of 25.78 GHz can be inhibited inside the upper case 200 and the lower case 201 of the optical module 2. Therefore, in the card edge connector 210, the connector 208, and the printed circuit board 11 of the optical transmission equipment 1, the radiation of the unnecessary electromagnetic wave caused by the common mode signal component can be reduced. Similarly to this mechanism, by arranging the resonator structure illustrated in FIG. 2 on the differential transmission line arranged on the printed circuit board 11 of the optical transmission equipment 1, it is possible to reduce the radiation of the unnecessary electromagnetic waves to the inside of the optical transmission equipment 1 and the radiation of the unnecessary electromagnetic waves to the outside of the optical transmission equipment 1 through air vents for air cooling and blowing and the like of the optical transmission equipment 1.

In addition, in the printed circuit board 21 illustrated in FIGS. 8 and 9, the CDR-IC 207 for reception is arranged on the printed circuit board 21. However, the present invention is not limited thereto, and the CDR-IC 207 may be mounted inside the ROSA 23A. In this case, since it is unnecessary to arrange the CDR-IC 207 on the printed circuit board 21, for each of the four-channel differential transmission lines, the area for arranging the first resonance conductor plate 104 illustrated in FIG. 2 on the printed circuit board 21 can be allocated more widely, and thus, the degree of freedom in circuit design of the printed circuit board 21 is improved.

Second Embodiment

Figure 10:
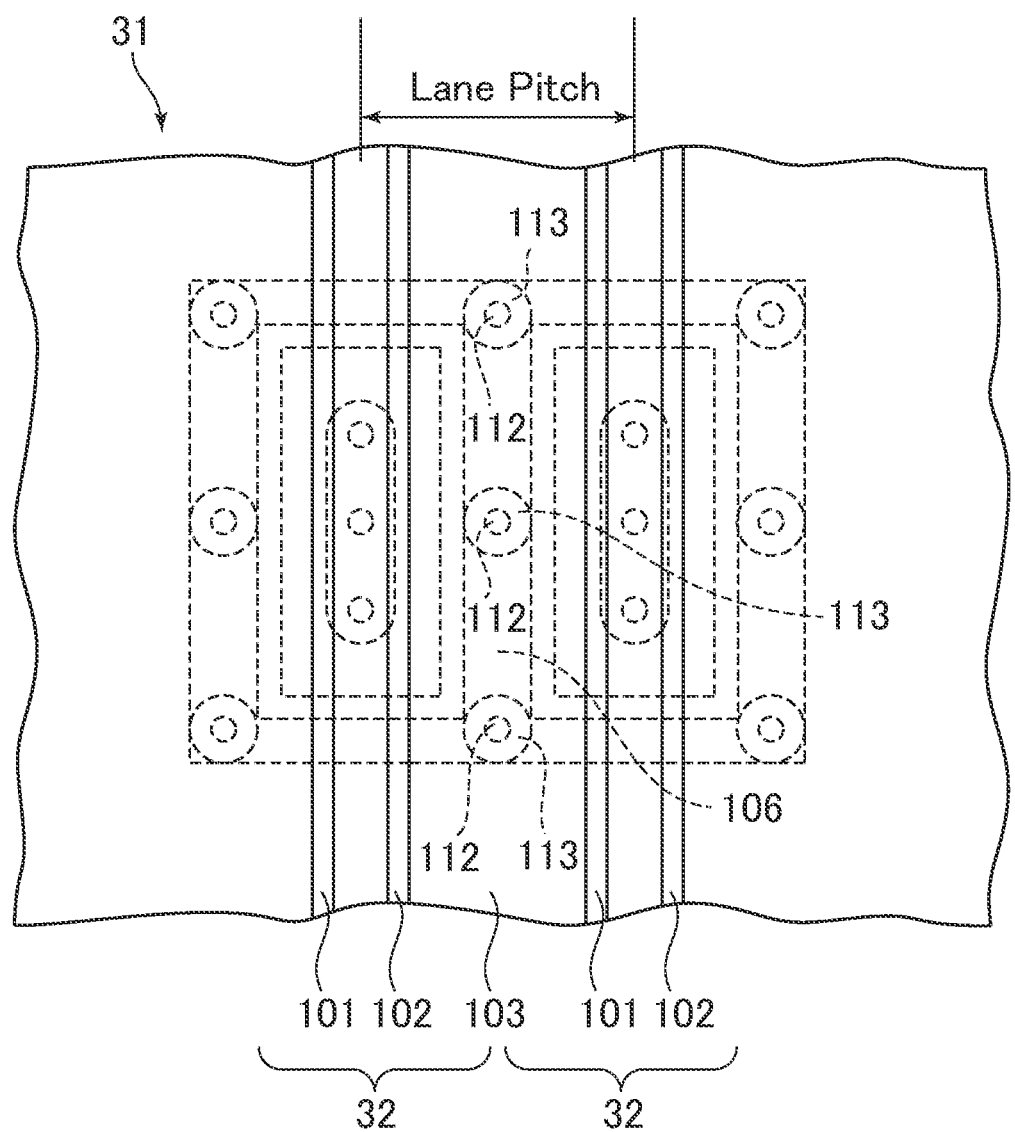
FIG. 10 is a schematic view illustrating a plane of a part of a printed circuit board according to a second embodiment of the present invention.
Figure 11:
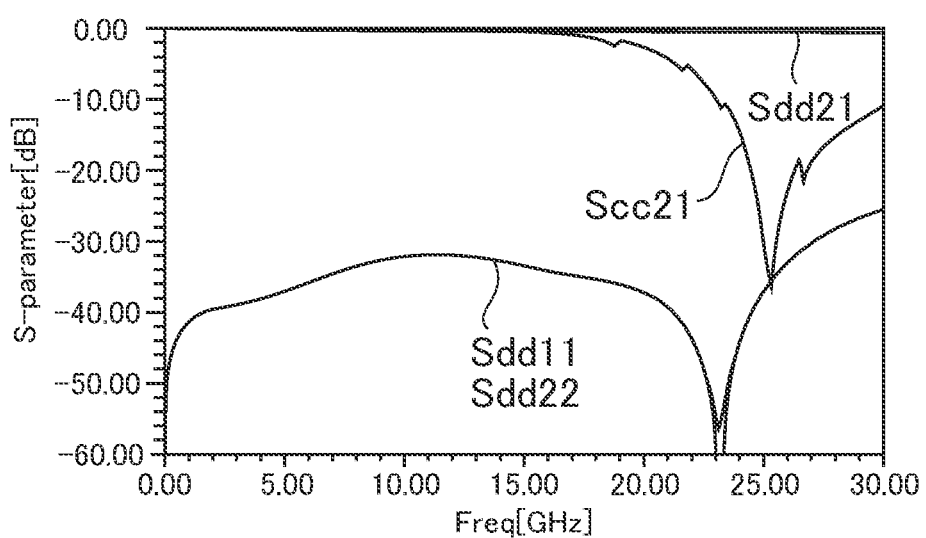
FIG. 11 is a view illustrating characteristics of a differential transmission line according to the second embodiment of the present invention.
Figure 12:
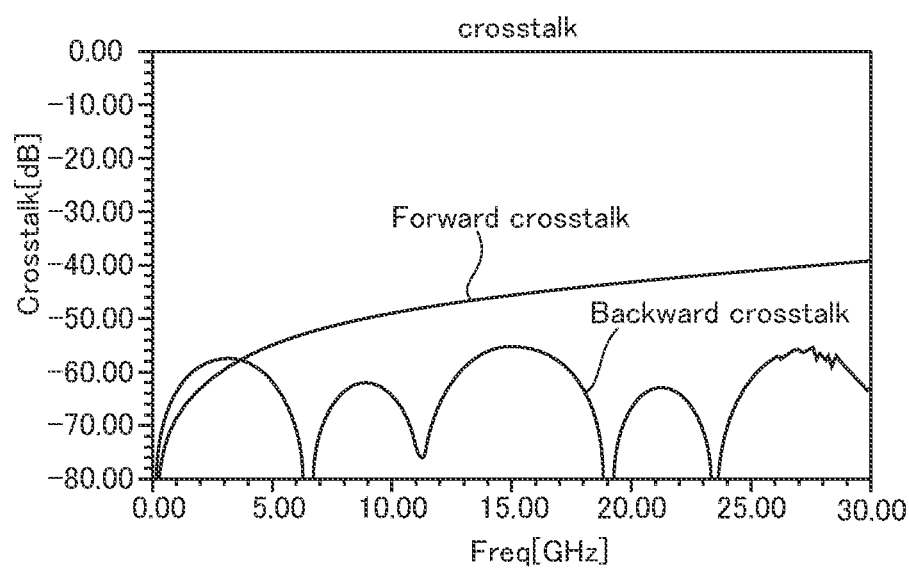
FIG. 12 is a view illustrating characteristics of the differential transmission line according to the second embodiment of the present invention.

FIG. 10 is a schematic view illustrating a part of a printed circuit board 31 according to a second embodiment of the present invention. FIGS. 11 and 12 are views illustrating characteristics of a differential transmission line 32 according to the embodiment. FIG. 11 illustrates frequency dependencies of differential mode passage characteristics (Sdd21), differential mode reflection characteristics (Sdd11, Sdd22), and common mode passage characteristics (Scc21) of the differential transmission line 32 according to the embodiment. FIG. 12 illustrates frequency dependencies of forward crosstalk characteristics (Sdd41) and backward crosstalk characteristics (Sdd31) in the differential mode of the differential transmission line 32 according to the embodiment.

The printed circuit board 31 according to the embodiment includes two-channel differential transmission lines 32, and each differential transmission line 32 has a resonator structure. The embodiment is different from the structure in which the two differential transmission lines 32 according to the first embodiment are aligned in order, in that the third resonance conductor plate 106 and a part of the third via holes 112 are used in common, but except for the above configurations, the printed circuit board 31 according to the embodiment has the same structures as that of the first embodiment.

The printed circuit board 31 according to the embodiment includes a plurality of pairs (here, two pairs) of strip conductors 101 and 102 that are arranged in the first layer and aligned in order along the second direction, a plurality of (here, two) first resonance conductor plates 104 that are arranged in the second layer and aligned in order along the second direction, a ground conductive layer 103 that has a plurality of (here, two) opening portions 108 respectively surrounding the plurality of first resonance conductor plates 104 without being in contact with the plurality of first resonance conductor plates 104, a plurality of (here, two) second resonance conductor plates 105 that are arranged in the third layer and aligned in order along the second direction and overlap so as to be included in the corresponding first resonance conductor plate 104 in plan view, a third resonance conductor plate 106 that is arranged in the fourth layer and overlaps so as to include the plurality of first resonance conductor plates 104 in plan view, a plurality of (here, two pairs of) first via holes 110 that respectively connect the first resonance conductor plate 104 and the corresponding plurality of second resonance conductor plates 105, a plurality of (here, two) second via holes 111 that respectively connect the plurality of second resonance conductor plates 105 and the third resonance conductor plate 106, and a plurality of (here, nine) third via holes 112 that connect the third resonance conductor plate 106 and the ground conductive layer 103.

A polygon obtained by sequentially connecting the centers of the two adjacent third via holes 112 among a part (here, six) of the plurality of third via holes 112 overlaps so as to include the corresponding first resonance conductor plate 104 in plan view. The center-to-center distance between the two adjacent third via holes 112 among the plurality of third via holes 112 is 0.5 wavelength or less at a frequency corresponding to the bit rate of the digital modulation signal to be transmitted.

As illustrated in FIG. 10, adjacent two-channel differential transmission lines 32 include two pairs of strip conductors 101 and 102. The center-to-center distance (lane pitch) between the two pairs of adjacent strip conductors 101 and 102 is 1.2 mm. Other dimensions are in accordance with the first embodiment.

In the embodiment, the configurations of the pair of strip conductors 101 and 102, the first resonance conductor plate 104, the second resonance conductor plate 105, one pair of first via holes 110, and the second via hole 111 provided in each differential transmission line 32 are the same as those of the first embodiment. The ground conductive layer 103 has two opening portions 108 that respectively surround the two first resonance conductor plates 104 without being in contact with the two first resonance conductor plates 104. The third resonance conductor plate 106 overlaps so as to include two first resonance conductor plates 104 in plan view. The nine third via holes 112 are arranged on the printed circuit board 31 according to the embodiment. Among the nine third via holes 112, the six third via holes 112 (aligned in the left column and the middle column) are arranged so as to surround the first resonance conductor plate 104 on the left side illustrated in FIG. 10, and the six third via holes 112 (aligned in the middle column and the right column) are arranged so as to surround the first resonance conductor plate 104 on the right side illustrated in FIG. 10. Among the nine third via holes 112 aligned in three columns, the three third via holes 112 aligned in the center are used in common to surround the first resonance conductor plate 104 on the left side, and to surround the first resonance conductor plate 104 on the right side.

A polygon obtained by sequentially connecting the centers of the two adjacent third via holes 112 among the six third via holes 112 (the left column and the middle column) is a rectangle and overlaps so as to include the first resonance conductor plate 104 on the left side in plan view, and the center-to-center distance between the two adjacent third via holes 112 among the six third via holes 112 is 0.5 wavelength or less at the frequency corresponding to the bit rate of the digital modulation signal to be transmitted. Similarly, a polygon obtained by sequentially connecting the centers of the two adjacent third via holes 112 among the six third via holes 112 (the middle column and the right column) is a rectangle and overlaps so as to include the first resonance conductor plate 104 on the right side in plan view, and the center-to-center distance between the two adjacent third via holes 112 among the six third via holes 112 is 0.5 wavelength or less at the frequency corresponding to the bit rate of the digital modulation signal to be transmitted.

As illustrated in FIG. 11, in the common mode passage characteristics (Scc21), an attenuation region centered on a frequency of 25.3 GHz is generated, and the conduction propagation of the common mode signal component with a frequency of 25.78 GHz can be inhibited by 25 dB or more. In addition, as illustrated in FIG. 12, despite the resonator structures of the two-channel differential transmission lines 32 and the two-channel differential transmission lines 32 are arranged to be close to each other, the deterioration of the forward crosstalk characteristics (Sdd41) does not occur, and a very good value of −40 dB or less is maintained in a frequency range of 0 to 25.78 GHz.

In the printed circuit board 31 according to the embodiment, the plurality of differential transmission lines 32 aligned in the second direction are arranged close to each other, and the resonator structures can be arranged adjacent thereto. In the printed circuit board 31 according to the embodiment, only the conduction propagation of the common mode signal component to the differential transmission line can be selectively inhibited while suppressing the deterioration of the crosstalk characteristics between the differential transmission lines 32.

Third Embodiment

Figure 13:
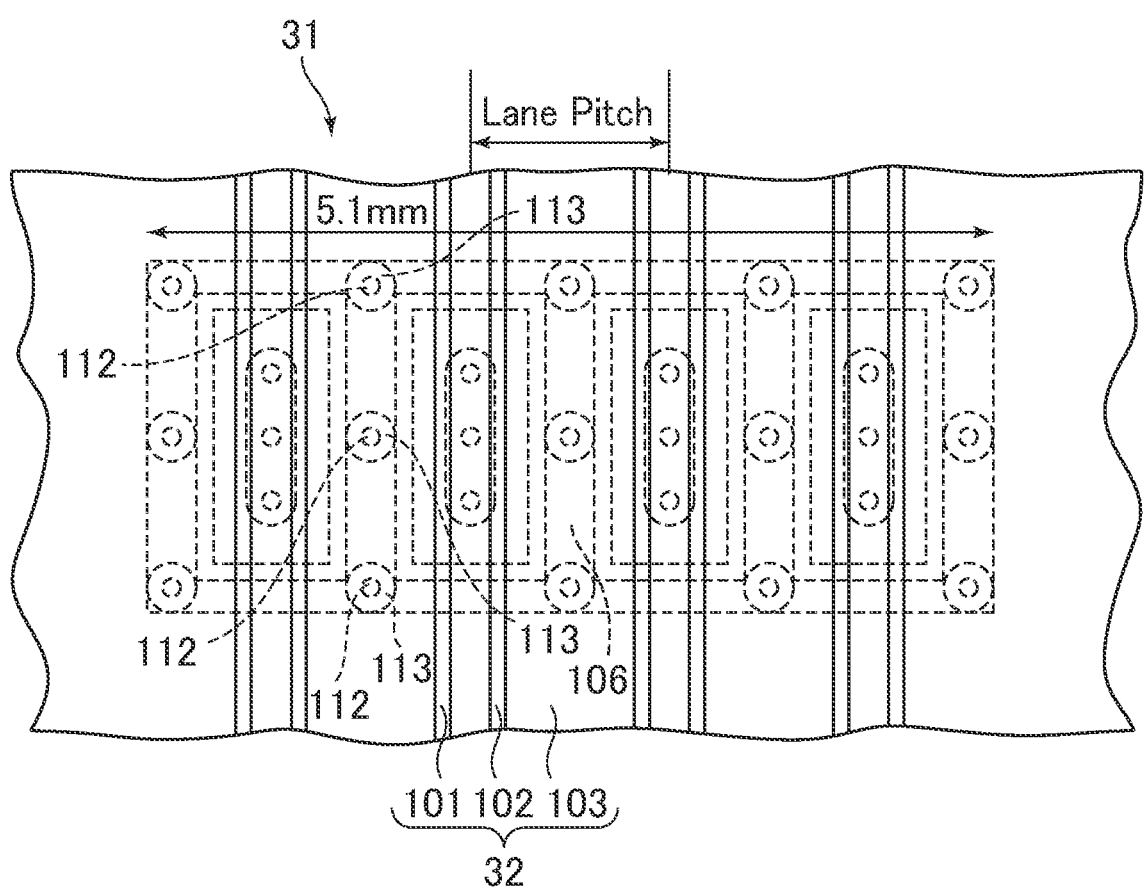
FIG. 13 is a schematic view illustrating a plane of a part of a printed circuit board according to a third embodiment of the present invention.

FIG. 13 is a schematic view illustrating a plane of a part of a printed circuit board 31 according to a third embodiment of the present invention. In the printed circuit board 31 according to the second embodiment, the two resonator structures are arranged adjacent to the two differential transmission lines 32, respectively. However, the printed circuit board 31 according to the third embodiment is different from the printed circuit board 31 according to the second embodiment in that four resonator structures are arranged adjacent to four-channel differential transmission lines 32 aligned in order in the second direction, respectively. Except for this configuration, the printed circuit board 31 according to the third embodiment has the same structures as the printed circuit board 31 according to the second embodiment.

The printed circuit board 31 according to the embodiment includes 4-channel differential transmission lines 32 aligned in order in the second direction, and each differential transmission line 32 has a resonator structure. The center-to-center distance (lane pitch) between the two adjacent pairs of strip conductors 101 and 102 among the four pairs of strip conductors 101 and 102 is 1.2 mm. Other dimensions are in accordance with the first and second embodiments. The width required for the arrangement of the four resonator structures arranged in the four-channel differential transmission lines 32 is 5.1 mm. The third resonance conductor plate 106 overlaps so as to include four first resonance conductor plates 104 in plan view.

Fifteen third via holes 112 are arranged on the printed circuit board 31 according to the embodiment. The six third via holes 112 which are a part of the fifteen third via holes 112 are arranged so as to surround the corresponding first resonance conductor plate 104 illustrated in FIG. 13. The three third via holes 112 arranged in the second column from the left illustrated in FIG. 13 together with the three third via holes 112 arranged in the first column from the left surround the first resonance conductor plate 104 which is the first plate from the left, and the three third via holes 112 arranged in the second column from the left together with the three third via holes 112 arranged in the third column from the left surround the first resonance conductor plate 104 which is the second plate from the left. That is, the three third via holes 112 arranged in the second column from the left commonly surround the first resonance conductor plate 104 which is the first plate from the left and the first resonance conductor plate 104 which is the second plate from the left. The same arrangement applies to the three third via holes 112 arranged in the third column from the left and to the three third via holes 112 arranged in the fourth column from the left.

The optical module 2 according to the embodiment is in accordance with QSFP 28, and the four differential transmission lines for transmission and the four differential transmission lines for reception are required to be arranged on a small-sized printed circuit board 31 with a board width of about 16 mm. In the printed circuit board according to the embodiment, the width required for the arrangement of the four resonator structures arranged in the four differential transmission lines 32 is 5.1 mm, which is sufficiently small to be less than half the board width of 16 mm, and the optical module 2 according to the embodiment is optimal for applying to QSFP 28.

As described above, in the printed circuit boards 31 according to the second and third embodiments, with respect to a plurality of (here, four channels) differential transmission lines, the adjacent two-channel differential transmission lines are arranged close to each other, and a plurality of resonator structures can be arranged in each of the plurality of differential transmission lines with the width along the second direction being reduced. Furthermore, only the conduction propagation of the common mode signal component to the differential transmission line can be selectively inhibited while suppressing the deterioration of the crosstalk characteristics between the differential transmission lines. In particular, this embodiment is very appropriate for the mounting the printed circuit board on the optical module 2 in accordance with the QSFP 28, in that the mounting area of a plurality of the differential transmission lines can be reduced.

Fourth Embodiment

Figure 14:
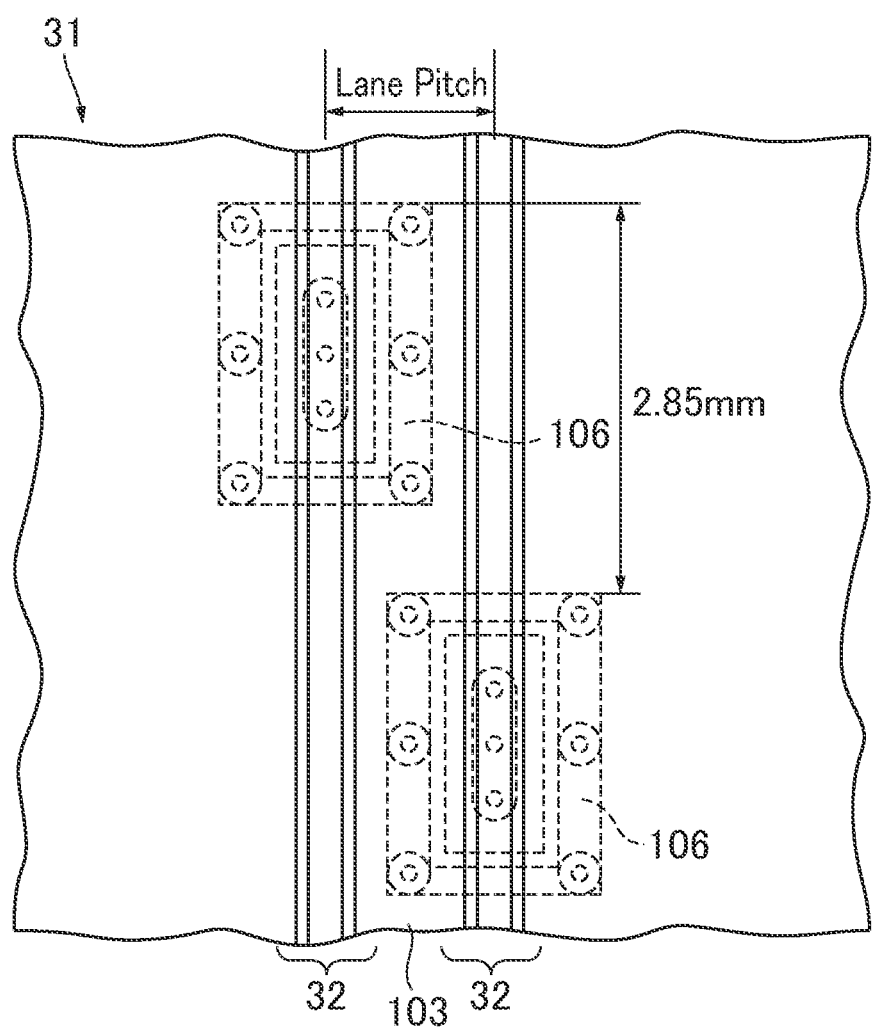
FIG. 14 is a schematic view illustrating a plane of a part of a printed circuit board according to a fourth embodiment of the present invention.
Figure 15:
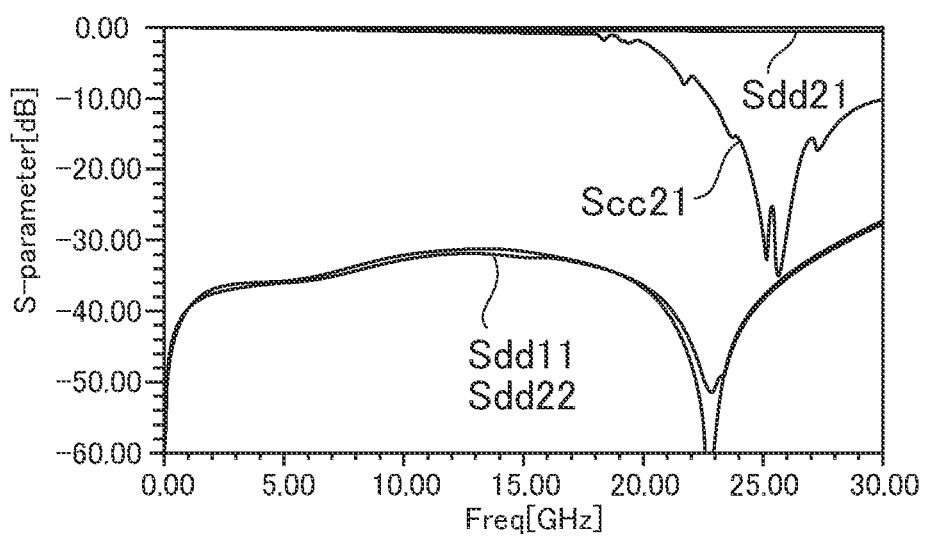
FIG. 15 is a view illustrating characteristics of a differential transmission line according to the fourth embodiment of the present invention.

FIG. 14 is a schematic view illustrating a plane of a part of a printed circuit board 31 according to a fourth embodiment of the present invention. FIG. 15 is a view illustrating characteristics of a differential transmission line 32 according to the embodiment. FIG. 15 illustrates frequency dependencies of differential mode passage characteristics (Sdd21), differential mode reflection characteristics (Sdd11, Sdd22), and common mode passage characteristics (Scc21) of the differential transmission line 32 according to the embodiment.

Similarly to the printed circuit board 31 according to the second embodiment, the printed circuit board 31 according to the embodiment includes two differential transmission lines 32, and each differential transmission line 32 has a resonator structure. However, the embodiment is different from the second embodiment in that the resonator structures of the differential transmission lines 32 are arranged independently of each other. Although the two differential transmission lines 32 according to the first embodiment are aligned in order, the positions of the resonator structures along the first direction are different. Except for this configuration, the printed circuit board 31 according to the embodiment has the same structures as those of the first and second embodiments.

As illustrated in FIG. 14, the adjacent two-channel differential transmission lines 32 include two pairs of strip conductors 101 and 102. The center-to-center distance (lane pitch) between the two pairs of adjacent strip conductors 101 and 102 is 1.2 mm similarly to the second embodiment. The positions along the first direction of the two first resonance conductor plates 104 arranged in the two-channel differential transmission lines 32 are shifted by 2.85 mm. That is, the first resonance conductor plate 104 overlapping with the pair of strip conductors 101 and 102 on the left side in plan view is shifted by 2.85 mm to the upper side in FIG. 14 from the first resonance conductor plate 104 overlapping with the pair of strip conductors 101 and 102 on the right side in plan view. Other dimensions are in accordance with the first embodiment.

As illustrated in FIG. 15, in the common mode passage characteristics (Scc21), although a plurality of the valleys are generated in the attenuation region due to the interaction between the resonators, the conduction propagation of the common mode signal component with a frequency of 25.78 GHz can be inhibited by 30 dB or more.

In the printed circuit board 31 according to the embodiment, the dimensions of the two resonator structures are increased in the first direction in comparison with the second embodiment. However, for each of the two differential transmission lines 32, the degree of freedom in arranging the resonator structure is improved, and thus, only the conduction propagation of the common mode signal component to the differential transmission line 32 can be selectively inhibited.

In addition, in the embodiment, the two resonator structures respectively arranged in the adjacent two-channel differential transmission lines 32 are arranged so as to be shifted by 2.85 mm along the first direction, but the present invention is not limited to the distance. In addition, the number of channels of the differential transmission lines is not limited to two and may be another number of channels.

Fifth Embodiment

Figure 16:
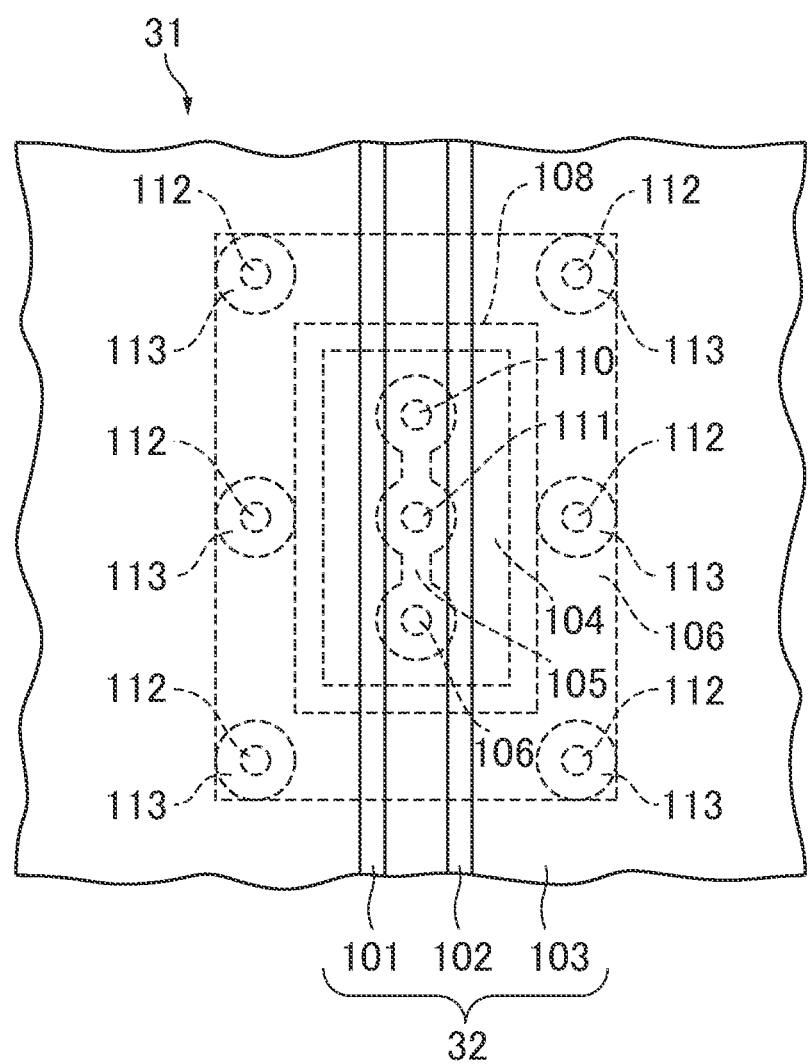
FIG. 16 is a schematic view illustrating a plane of a part of a printed circuit board according to a fifth embodiment of the present invention.
Figure 17:
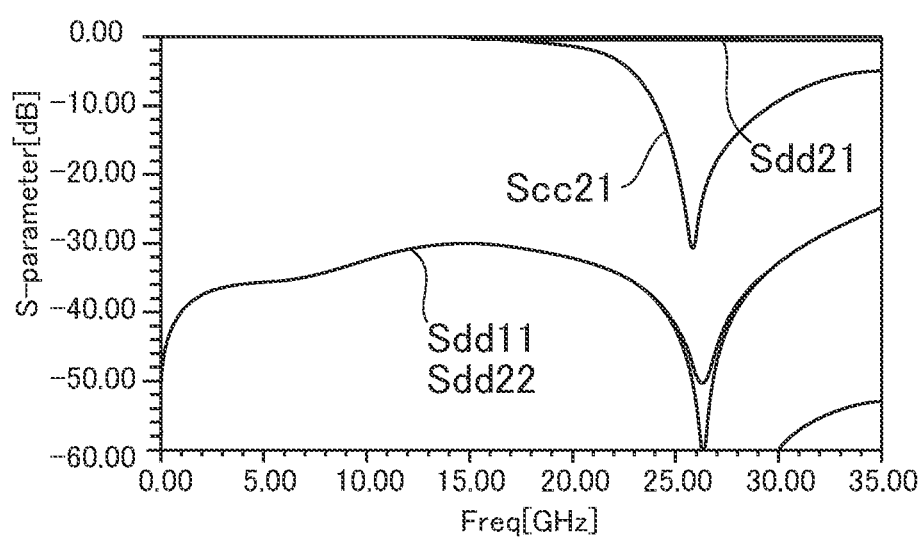
FIG. 17 is a view illustrating characteristics of a differential transmission line according to the fifth embodiment of the present invention.

FIG. 16 is a schematic view illustrating a plane of a part of a printed circuit board 31 according to a fifth embodiment of the present invention. FIG. 17 is a view illustrating characteristics of a differential transmission line 32 according to the embodiment. FIG. 17 illustrates frequency dependencies of differential mode passage characteristics (Sdd21), differential mode reflection characteristics (Sdd11 and Sdd22), and common mode passage characteristics (Scc21) of the differential transmission line 32 according to the embodiment.

The shape of the resonator structure of the differential transmission line 32 according to the embodiment is different from that of the first embodiment, but the other structures are the same. The first length L1 of the first resonance conductor plate 104 along the first direction is 1.3 mm, and the first width W1 along the second direction is 0.7 mm similarly to the first embodiment. Along with this, the second length L2 of the opening portion 108 of the ground conductive layer 103 is 1.5 mm. The first width W2 is 0.9 mm similarly to the first embodiment. The shape of the second resonance conductor plate 105 is a shape in which a rectangle with a width of 0.1 mm overlaps with three circular shapes (land shapes) with a diameter of 0.3 mm arranged at intervals of 0.4 mm so as to be connected to each other. In order to maintain the resonance frequency of the resonator structure to a desired value and to adjust the effect of narrowing the width of the rectangular portion of the second resonance conductor plate 105 to 0.1 mm, the shape of the first resonance conductor plate 104 is changed. Other dimensions are in accordance with the first embodiment. In the first to fourth embodiments, the shape of the second resonance conductor plate 105 is a rectangular shape extending in the first direction except for both ends, but the present invention is not limited thereto. Similarly to the embodiment, any shapes extending in the first direction may be employed.

As illustrated in FIG. 17, in the common mode passage characteristics (Scc21), an attenuation region centered on a frequency of 25.9 GHz is generated, and the conduction propagation of the common mode signal component with a frequency of 25.78 GHz can be inhibited by 28 dB or more. In addition, despite the resonance circuit intersects the differential transmission line 32, there is almost no deterioration of the differential mode reflection characteristics (Sdd11 and Sdd22), and a very good value of −30 dB or less is maintained in a wider frequency range of 0 to 32 GHz. The printed circuit board 31 according to the embodiment exhibits better characteristics than that of the first embodiment, and it is considered that the shortening of the first length L1 of the first resonance conductor plate 104 contributes to this.

Sixth Embodiment

Figure 18:
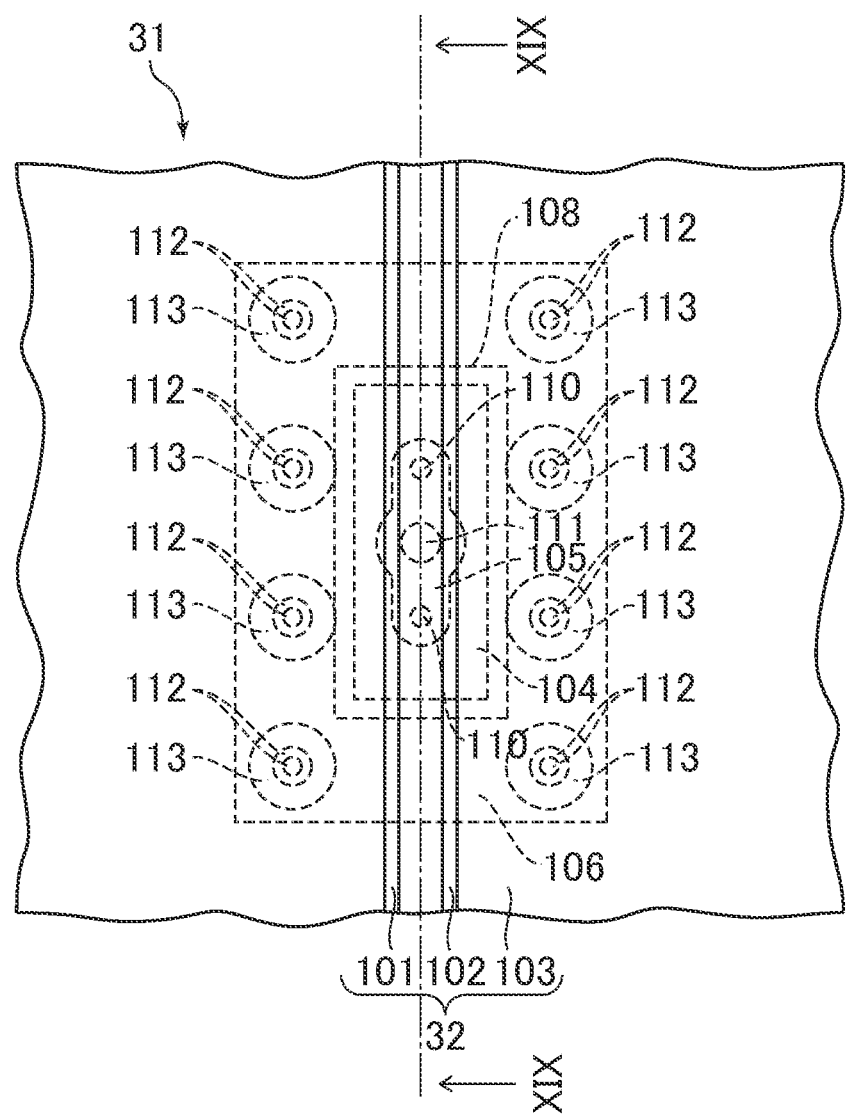
FIG. 18 is a schematic view illustrating a plane of a part of the printed circuit board according to the fifth embodiment of the present invention.
Figure 19:
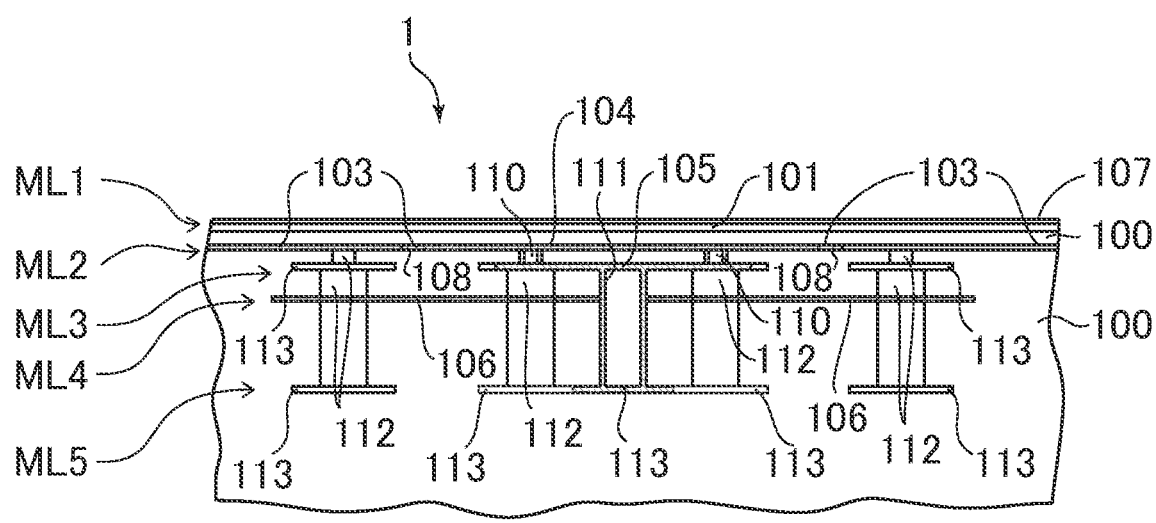
FIG. 19 is a schematic view illustrating a cross-section of a part of the printed circuit board according to the fifth embodiment of the present invention.

FIG. 18 is a schematic view illustrating a plane of a part of a printed circuit board 31 according to a sixth embodiment of the present invention. FIG. 19 is a schematic view illustrating a cross-section of a part of the printed circuit board 31 according to the embodiment. FIG. 19 illustrates a cross-section taken along line XIX-XIX illustrated in FIG. 18.

The printed circuit board 31 according to the embodiment is different from that of the first embodiment in that the via hole connecting the third layer and the fourth layer is a via hole formed by a drill rather than a laser via. Accordingly, the shapes and arrangement of the ground conductive layer 103, the first resonance conductor plate 104, the second resonance conductor plate 105, the third resonance conductor plate 105, the second via hole 111, the third via holes 112, and the lands 113 are different from those of the first embodiment, but except for this configuration, the embodiment has the same structures as the first embodiment. Here, the first resonance conductor plate 104 has a rectangular shape having the first length L1 of 1.7 mm and the first width W1 of 0.7 mm. The opening portion 108 of the ground conductive layer 103 has a rectangular shape having the second length L2 of 1.9 mm and the second width W2 of 0.9 mm. The second resonance conductor plate 105 has a shape obtained by overlapping with a circular shape with a diameter of 0.45 mm and a center overlapping with the center O in plan view, circular shapes with a diameter of 0.3 mm at positions respectively separated by 0.4 mm along the first direction, and a rectangular shape with a width of 0.3 mm connecting the circular shapes.

As illustrated in FIGS. 18 and 19, eight third via holes 112 are arranged on the printed circuit board 31 according to the embodiment. One pair of first via holes 110 connecting the second layer (second metal layer ML2) and the third layer (third metal layer ML3) and the upper portions of the eight third via holes 112 are formed with the laser vias similarly to the first embodiment. On the contrary, the second via hole 111 and the lower portions of the eight third via holes 112 are formed by drilling unlike the first embodiment. In order to stably form the via holes by drilling, the lands 113 are arranged respectively on the upper layer and the lower layer of the via holes. The lands 113 are arranged in the third layer (third metal layer ML3) and the fifth layer (fifth metal layer ML5). In addition, the fifth layer is arranged further below the fourth layer. The second via hole 111 is formed between the second resonance conductor plate 105 having a land function (a circular shape with a diameter of 0.45 mm) and the land 113 with a diameter of 0.45 mm arranged in the fifth layer. The via hole is formed by forming a cylindrical hole extending along the stacking direction in the dielectric layer 100 with drilling and applying copper plating to the side of the hole. Here, the diameter of the via hole formed by the drilling is 0.2 mm.

In the embodiment, the eight third via holes 112 are arranged to surround the first resonance conductor plate 104 in plan view. A polygon obtained by sequentially connecting the centers of the two adjacent third via holes 112 among the eight third via holes 112 is substantially a rectangle and overlaps so as to include the first resonance conductor plate 104 in plan view. The length of the rectangle along the first direction is 2.4 mm, and the width along the second direction is 1.35 mm. The center-to-center distance between the two adjacent third via holes 112 is 0.80 mm along the first direction, and 1.35 mm along the second direction. The other dimensions may be selected according to the thickness or the like of each layer to be applied so that the attenuation region in the common mode passage characteristics (Scc21) has a desired frequency. It is preferable to use a three-dimensional electromagnetic field analysis tool to calculate the dimensions.

According to the embodiment, the relatively expensive build-up process required to form the laser via can be reduced by at least one layer, and thus, it is possible to manufacture the printed circuit board at low cost.

The printed circuit board, the optical module, and the optical transmission equipment according to the embodiments of the present invention have been described above. The present invention is not limited to the above embodiments and can be widely applied to a printed circuit board having a differential transmission line of a microstrip line type which has a resonator structure. The printed circuit board according to the present invention is a printed circuit board provided in an optical transmission equipment or an optical module, but may be a printed circuit board that can be provided in another device. In addition, in the printed circuit board according to the embodiments of the present invention, the cases where the bit rate of the digital electric signal transmitted through each channel is 25.78 Gbit/s is described. However, the present invention is not limited to the above bit rate, but can also be applied to higher bit rates.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A printed circuit board comprising:
   a pair of strip conductors, being arranged in a first layer and extending to be aligned along a first direction;
   a first resonance conductor plate, being arranged in a second layer located below the first layer, overlapping with a first portion of the pair of strip conductors, which has a first length along the first direction, in plan view, and extending further outward from each outer edge of the first portion of the pair of strip conductors along a second direction intersecting the first direction;
a ground conductive layer, being arranged in the second layer and including an opening portion surrounding the first resonance conductor plate without being in contact with the first resonance conductor plate;
a second resonance conductor plate, being arranged in a third layer located below the second layer, overlapping so as to be included in the first resonance conductor plate in plan view, and extending in the first direction along the center line of the pair of strip conductors;
a third resonance conductor plate, being arranged in a fourth layer located below the third layer and overlapping so as to include the first resonance conductor plate in plan view;
a plurality of first via holes, connecting the first resonance conductor plate and the second resonance conductor plate;
a second via hole, connecting the second resonance conductor plate and the third resonance conductor plate; and
a plurality of third via holes, connecting the third resonance conductor plate and the ground conductive layer,
wherein a polygon obtained by sequentially connecting centers of two adjacent third via holes among the plurality of third via holes overlaps so as to include the first resonance conductor plate in plan view, and
wherein a center-to-center distance between the two adjacent third via holes among the plurality of third via holes is 0.5 wavelength or less at a frequency corresponding to a bit rate of a digital modulation signal to be transmitted.

2. The printed circuit board according to claim 1, wherein the first resonance conductor plate has a shape that is substantially line-symmetrical with respect to the centerline of the pair of strip conductors.

3. The printed circuit board according to claim 1, wherein the second resonance conductor plate has a shape that is substantially line-symmetrical with respect to the centerline of the pair of strip conductors.

4. The printed circuit board according to claim 1, further comprising:
a plurality of pairs of strip conductors, being arranged in the first layer and being aligned in order along the second direction;
a plurality of first resonance conductor plates, being arranged in the second layer and being aligned in order along the second direction;
a plurality of second resonance conductor plates, being arranged in the third layer and being aligned in order along the second direction, and overlapping so as to be included in the corresponding first resonance conductor plate in plan view;
a plurality of first via holes, respectively connecting the plurality of first resonance conductor plates and the corresponding plurality of second resonance conductor plates; and
a plurality of second via holes, respectively connecting the plurality of second resonance conductor plates and the third resonance conductor plate,
wherein the ground conductive layer includes a plurality of opening portions surrounding each of the plurality of first resonance conductor plates without being in contact with the plurality of first resonance conductor plates,
wherein the third resonance conductor plate overlaps so as to include the plurality of first resonance conductor plates in plan view,
wherein a polygon obtained by sequentially connecting centers of the two adjacent third via holes among the third via holes which are a part of the plurality of third via holes overlaps so as to include the corresponding first resonance conductor plate in plan view, and
wherein the center-to-center distance between the two adjacent third via holes among the plurality of third via holes is 0.5 wavelength or less at a frequency corresponding to the bit rate of the digital modulation signal to be transmitted.

5. The printed circuit board according to claim 1, wherein an angle between the first direction and the second direction is 85° or more and 90° or less.

6. The printed circuit board according to claim 1, wherein the first direction and the second direction are substantially perpendicular to each other.

7. An optical module comprising the printed circuit board according to claim 1,
wherein the printed circuit board further includes an IC that drives the digital modulation signal.

8. The optical module according to claim 7, further comprising a metal case, converting the printed circuit board to form an electromagnetic shield and including an opening portion for exposing a part of the printed circuit board to the outside.

9. An optical transmission equipment on which the optical module according to claim 7 is mounted.

10. An optical transmission equipment comprising the printed circuit board according to claim 1,
wherein the printed circuit board further includes an IC that drives the digital modulation signal.

* * * * *